United States Patent
Heo et al.

(10) Patent No.: US 12,328,979 B2
(45) Date of Patent: Jun. 10, 2025

(54) METHOD OF MANUFACTURING DISPLAY DEVICE USING SEMICONDUCTOR LIGHT EMITTING ELEMENT

(71) Applicant: LG ELECTRONICS INC., Seoul (KR)

(72) Inventors: Mihee Heo, Seoul (KR); Junghoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 539 days.

(21) Appl. No.: 17/775,746

(22) PCT Filed: Nov. 15, 2019

(86) PCT No.: PCT/KR2019/015638
§ 371 (c)(1),
(2) Date: May 10, 2022

(87) PCT Pub. No.: WO2021/095938
PCT Pub. Date: May 20, 2021

(65) Prior Publication Data
US 2022/0393074 A1 Dec. 8, 2022

(30) Foreign Application Priority Data
Nov. 11, 2019 (KR) .......................... 10-2019-0143750

(51) Int. Cl.
*H10H 20/84* (2025.01)
*H01L 21/683* (2006.01)
(Continued)

(52) U.S. Cl.
CPC ......... *H10H 20/84* (2025.01); *H01L 21/6835* (2013.01); *H01L 24/32* (2013.01);
(Continued)

(58) Field of Classification Search
CPC ..... H01L 21/6835; H01L 33/44; H01L 24/95; H10H 20/84
See application file for complete search history.

(56) References Cited

U.S. PATENT DOCUMENTS

| 2010/0187002 A1 | 7/2010 | Lee et al. |
| 2012/0135158 A1 | 5/2012 | Freer et al. |

(Continued)

FOREIGN PATENT DOCUMENTS

| KR | 10-2007-0096212 A | 10/2007 |
| KR | 10-2010-0123755 A | 11/2010 |

(Continued)

*Primary Examiner* — Eric K Ashbahian
(74) *Attorney, Agent, or Firm* — Birch, Stewart, Kolasch & Birch, LLP

(57) ABSTRACT

A method of manufacturing a display device according to the present invention involves assembling a semiconductor light emitting element to an assembly substrate and then transferring the same to a wiring substrate, wherein, during self-assembly using magnetic and electric fields, the semiconductor light emitting element is fixed to the assembly substrate by forming a covalent bond between the semiconductor light emitting element and the assembly substrate so that the semiconductor light emitting element does not become separated from the assembly substrate, and when transferring the assembled object to the wiring substrate, the formed covalent bond is broken down so that the semiconductor light emitting element can be easily detached from the assembly substrate.

18 Claims, 22 Drawing Sheets

(51) Int. Cl.
*H01L 23/00* (2006.01)
*H01L 25/075* (2006.01)
*H10H 20/01* (2025.01)
*H10H 20/825* (2025.01)

(52) U.S. Cl.
CPC .............. H01L 24/83 (2013.01); H01L 24/95 (2013.01); H01L 25/0753 (2013.01); *H01L 2221/68368* (2013.01); *H01L 2221/68381* (2013.01); *H01L 2224/32225* (2013.01); *H01L 2224/83005* (2013.01); *H01L 2224/83192* (2013.01); *H01L 2224/83201* (2013.01); *H01L 2224/95001* (2013.01); *H01L 2224/95101* (2013.01); *H10H 20/034* (2025.01); *H10H 20/825* (2025.01)

(56) References Cited

U.S. PATENT DOCUMENTS

| | | |
|---|---|---|
| 2014/0261613 A1 | 9/2014 | Nielson et al. |
| 2018/0029038 A1 | 2/2018 | Sasaki et al. |
| 2018/0219138 A1 | 8/2018 | Sasaki et al. |
| 2019/0058080 A1 | 2/2019 | Ahmed et al. |
| 2020/0251457 A1* | 8/2020 | Huang ................ H01L 23/4985 |
| 2021/0111370 A1* | 4/2021 | Yang .................... H10K 71/135 |
| 2021/0202800 A1* | 7/2021 | Jung .................... H10K 85/658 |

FOREIGN PATENT DOCUMENTS

| | | |
|---|---|---|
| KR | 10-2017-0041912 A | 4/2017 |
| KR | 10-2019-0121274 A | 10/2019 |
| KR | 10-2019-0122113 A | 10/2019 |

* cited by examiner

TPSA (a)

GPTMS (b)

BTD (c)

SATES (d)

METHOD OF MANUFACTURING DISPLAY DEVICE USING SEMICONDUCTOR LIGHT EMITTING ELEMENT

CROSS REFERENCE TO RELATED APPLICATIONS

This Application is the National Stage filing under 35 U.S.C. 371 of International Application No. PCT/KR2019/015638, filed on Nov. 15, 2019, which claims the benefit of earlier filing date and right of priority to Korean Application No. 10-2019-0143750, filed on Nov. 11, 2019, the contents of all these applications are hereby expressly incorporated by reference into the present application.

TECHNICAL FIELD

The present disclosure relates to a method of manufacturing a display device using a semiconductor light emitting element having a size of several to several tens of micrometers.

BACKGROUND ART

In recent years, liquid crystal displays (LCDs), organic light emitting diode (OLED) displays, and micro LED displays have been competed to implement a large-area display in the field of display technology.

However, there exist problems such as not-so-fast response time, low efficiency of light generated by backlight in case of LCDs, and there exist drawbacks such as short life span, not-so-good yield as well as low efficiency in case of OLEDs.

On the contrary, when semiconductor light emitting elements (micro LEDs) having a diameter or a cross sectional area of 100 micrometers or less are used in a display, the display may provide a very high efficiency because it does not absorb light using a polarizing plate or the like. However, since a large-sized display requires millions of semiconductor light emitting elements, it has difficulty in transferring the devices compared to other technologies.

Technologies currently in development for transfer processes include pick & place, laser lift-off (LLO), self-assembly, or the like. Among them, the self-assembly method, which is a method in which the semiconductor light emitting element locates themselves in a fluid, is the most advantageous method for realizing a large-sized display device.

On the other hand, the self-assembly method includes a method of directly assembling the semiconductor light emitting element to a wiring substrate (or final substrate) on which wiring is disposed, and a method of assembling the semiconductor light emitting element on an assembly substrate and transferring the semiconductor light emitting element to the final substrate through an additional transfer process.

The direct assembly method on the final substrate is efficient in terms of process, and in the case of using the assembly substrate, there is an advantage in that a structure for self-assembly can be added without limitation, and therefore, the two methods are selectively used.

DISCLOSURE OF INVENTION

Technical Problem

An aspect of the present disclosure, in a method of assembling a semiconductor light emitting element on an assembly substrate and then transferring the semiconductor light emitting element to a wiring substrate, is to provide a method of manufacturing a display device in which a covalent bond is formed between the semiconductor light emitting element and the assembly substrate to prevent the semiconductor light emitting element from being separated from the assembly substrate so as to fix the semiconductor light emitting element to the assembly substrate while self-assembly using magnetic and electric fields is in progress, and the formed covalent bond is cleaved to allow the semiconductor light emitting element to be easily detached from the assembly substrate when transferring to the wiring substrate.

Solution to Problem

According to an embodiment of the present disclosure, there is provided a method of manufacturing a display device for seating semiconductor light emitting elements placed into a chamber containing a fluid at preset positions of an assembly substrate including assembly electrodes using electric and magnetic fields, and the method may include placing the assembly substrate to be immersed in the fluid in the chamber while one surface of the assembly substrate including the assembly electrodes faces a bottom surface of the chamber; applying a voltage to at least some of the assembly electrodes to seat the semiconductor light emitting elements at preset positions of the assembly substrate; forming a covalent bond between the semiconductor light emitting elements and a surface of the assembly substrate such that the semiconductor light emitting elements are fixed to the assembly substrate; separating the assembly substrate from the fluid; cleaving the covalent bond formed between the semiconductor light emitting elements and the surface of the assembly substrate; and transferring the semiconductor light emitting elements to a wiring substrate on which wiring electrodes are disposed, wherein the forming a covalent bond between the semiconductor light emitting elements and the surface of the assembly substrate is carried out at the same time as the seating the semiconductor light emitting elements at preset positions of the assembly substrate, or after the seating the semiconductor light emitting elements.

According to the present embodiment, the semiconductor light emitting element and the surface of the assembly substrate may include at least one of a predetermined functional group and a predetermined compound for forming a covalent bond between the semiconductor light emitting elements and the surface of the assembly substrate.

According to the present embodiment, the assembly substrate may include a base portion on which the assembly electrodes are disposed; a dielectric layer deposited on the base portion to cover the assembly electrodes; and a partition wall deposited on the dielectric layer while forming a cell in which the semiconductor light emitting element is seated along an extension direction of the assembly electrode to overlap with part of the assembly electrode, wherein the dielectric layer includes at least one of the predetermined functional group and the predetermined compound.

According to the present embodiment, the predetermined functional group formed on the semiconductor light emitting element and the surface of the assembly substrate may be a hydroxyl group.

According to the present embodiment, the predetermined compound bonded to the semiconductor light emitting element and the surface of the assembly substrate may be a silane coupling agent, and the silane coupling agent may be bonded to at least one of the semiconductor light emitting element and the surface of the assembly substrate.

According to the present embodiment, a covalent bond may be formed between the semiconductor light emitting elements and the predetermined compound bonded to the surface of the assembly substrate, or a covalent bond may be formed between the predetermined compound bonded to the surface of the assembly substrate and the predetermined functional group formed on surfaces of the semiconductor light emitting elements.

According to the present embodiment, the silane coupling agent may include a reactor for forming either one of a Si—O bond and a C—O bond with the semiconductor light emitting element and the surface of the assembly substrate.

According to the present embodiment, the silane coupling agent may further include an intramolecular S—S bond.

According to the present embodiment, the silane coupling agent may further include an intramolecular nitro benzyl group.

According to the present embodiment, when the silane coupling agent is coupled to a surface of the semiconductor light emitting element and a surface of the assembly substrate, either one of the silane coupling agent coupled to the surface of the semiconductor light emitting element and the silane coupling agent coupled to the surface of the assembly substrate may further include an intramolecular conjugate diene, and the other one may further include an intramolecular multiple bond.

According to the present embodiment, the cleaving a covalent bond formed between the semiconductor light emitting elements and the surface of the assembly substrate may be cleaved by any one of a reduction reaction, a light treatment and a heat treatment.

Advantageous Effects of Invention

A method of manufacturing a display device according to an embodiment of the present disclosure may form a covalent bond between a surface of an assembly substrate and semiconductor light emitting elements to prevent the semiconductor light emitting elements from being separated from the assembly substrate due to an impact applied to the assembly substrate while self-assembly is in progress in a fluid or when the assembly substrate is separated from the fluid after the self-assembly, thereby having an effect capable of improving transfer yield in a subsequent step of transferring the semiconductor light emitting elements to a wiring substrate.

In addition, cleaving the covalent bond formed between the semiconductor light emitting elements and the surface of the assembly substrate may be performed after separating the assembly substrate from the fluid, but before transferring the semiconductor light emitting elements to the wiring substrate, thereby having an effect capable of allowing the semiconductor light emitting elements to be easily detached from the assembly substrate.

MODE FOR THE INVENTION

Figure 1:
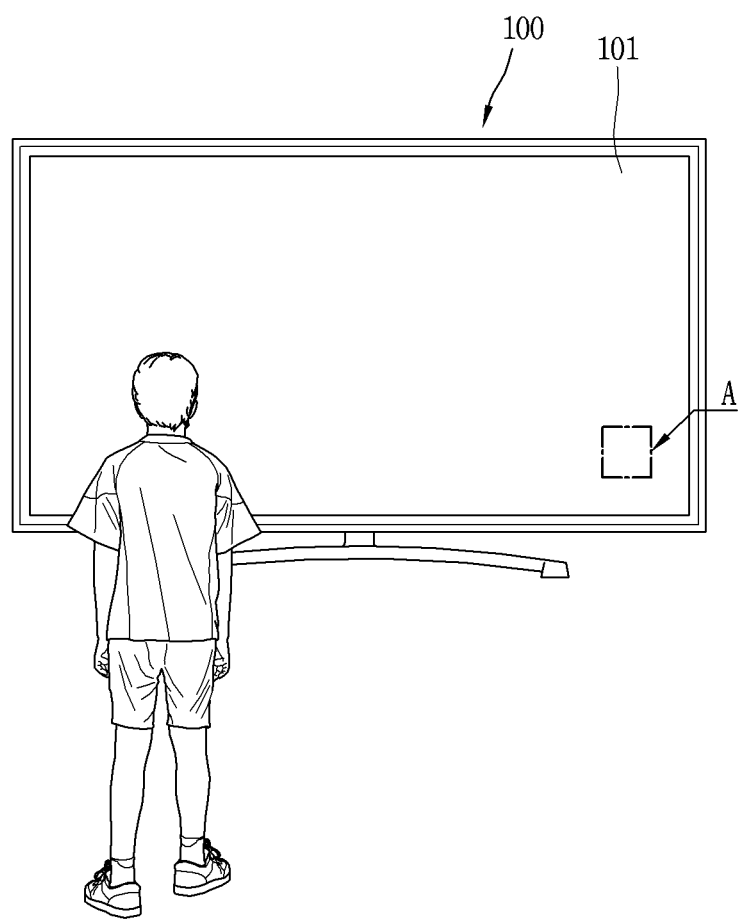
FIG. 1 is a conceptual view showing a display device using a semiconductor light emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings. Furthermore, it will be understood that when an element such as a layer, region or substrate is referred to as being "on" another element, it can be directly on the another element or an intermediate element may also be interposed therebetween.

A display device disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, even if a new product type to be developed later includes a display, a configuration according to an embodiment disclosed herein may be applicable thereto.

Figure 2:
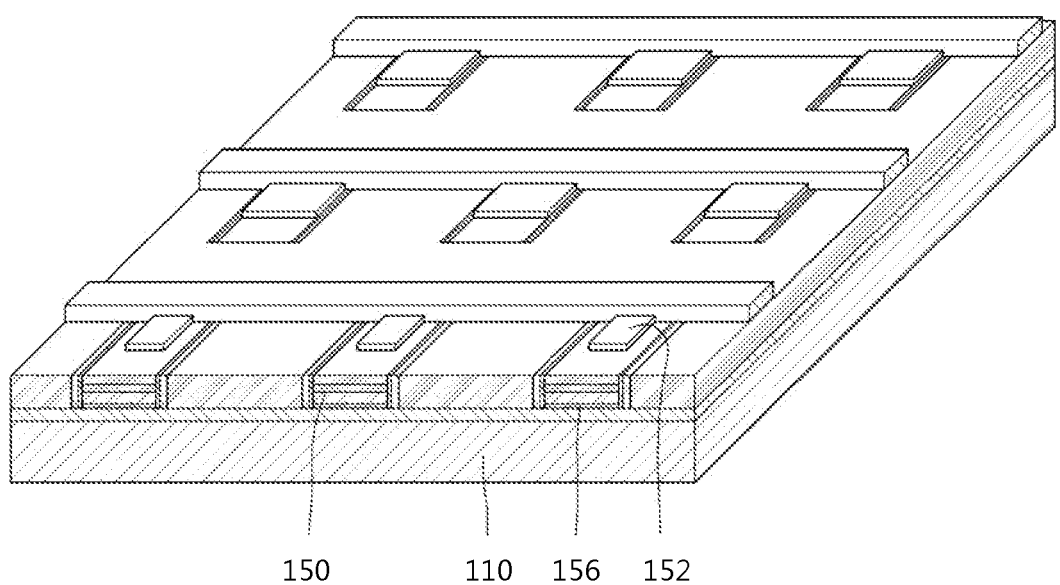
FIG. 2 is a partially enlarged view showing a portion "A" of the display device in FIG. 1.
Figure 3:
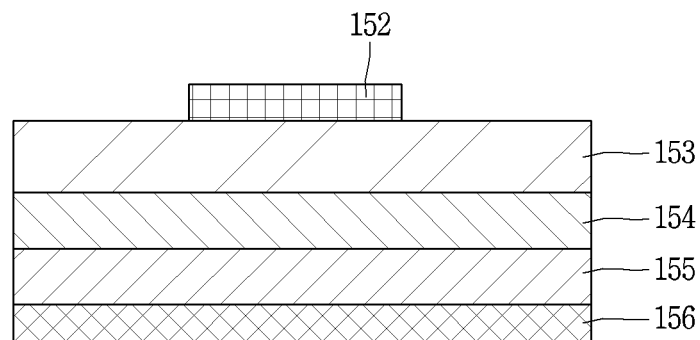
FIG. 3 is an enlarged view showing a semiconductor light emitting element in FIG. 2.
Figure 4:
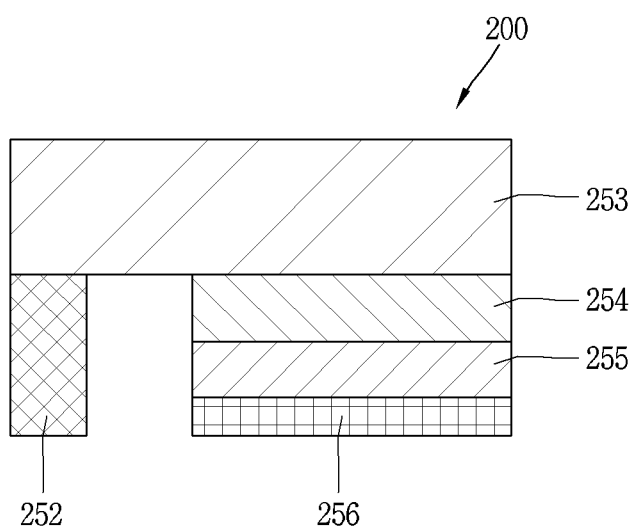
FIG. 4 is an enlarged view showing another embodiment of the semiconductor light emitting element in FIG. 2.

FIG. 1 is a conceptual view showing a display device using a semiconductor light emitting element according to an embodiment of the present disclosure, and FIG. 2 is a partially enlarged view showing a portion "A" of the display device in FIG. 1, and FIG. 3 is an enlarged view showing a semiconductor light emitting element in FIG. 2, and FIG. 4 is an enlarged view showing another embodiment of the semiconductor light emitting element in FIG. 2.

According to the illustration, information processed in the controller of the display device 100 may be displayed on a display module 140. A case 101 in the form of a closed loop surrounding an edge of the display module may form a bezel of the display device.

The display module 140 may include a panel 141 on which an image is displayed, and the panel 141 may include micro-sized semiconductor light emitting elements 150 and a wiring substrate 110 on which the semiconductor light emitting elements 150 are mounted.

Wiring lines may be formed on the wiring substrate 110, and connected to an n-type electrode 152 and a p-type electrode 156 of the semiconductor light emitting element 150. Through this, the semiconductor light emitting element 150 may be provided on the wiring substrate 110 as a self-emitting individual pixel.

An image displayed on the panel 141 is visual information, and implemented by independently controlling the light emission of a sub-pixel arranged in a matrix form through the wiring lines.

According to the present disclosure, a micro LED (Light Emitting Diode) is illustrated as one type of the semiconductor light emitting element 150 that converts current into light. The micro LED may be a light emitting diode formed with a small size of 100 microns or less. The semiconductor light emitting element 150 may be provided in blue, red, and green light emitting regions, respectively, to implement a sub-pixel by a combination of the light emitting regions. In other words, the sub-pixel denotes a minimum unit for implementing a single color, and at least three micro LEDs may be provided in the sub-pixel.

More specifically, referring to FIG. 3, the semiconductor light emitting element 150 may be a vertical structure.

For example, the semiconductor light emitting elements 150 may be implemented with a high-power light emitting element that emits various lights including blue in which gallium nitride (GaN) is mostly used, and indium (In) and or aluminum (Al) are added thereto.

The vertical semiconductor light emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate, and the n-type electrode 152 located at the top may be electrically connected to an n-electrode at an upper side of the semiconductor light emitting element. The electrodes may be disposed in the upward/downward direction in the vertical semiconductor light emitting element 150, thereby providing a great advantage capable of reducing the chip size.

For another example, referring to FIG. 4, the semiconductor light emitting element may be a flip chip type semiconductor light emitting element.

For such an example, the semiconductor light emitting element 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate at the bottom of the semiconductor light emitting element.

The vertical semiconductor light emitting element and the horizontal semiconductor light emitting element may be a green semiconductor light emitting element, a blue semiconductor light emitting element, or a red semiconductor light emitting element, respectively. The green semiconductor light emitting element and the blue semiconductor light emitting element may be mostly formed of gallium nitride (GaN), and indium (In) and/or aluminum (Al) may be added thereto to implement a high-power light emitting element that emits green or blue light. For such an example, the semiconductor light emitting element may be a gallium nitride thin-film formed in various layers such as n-Gan, p-Gan, AlGaN, and InGa, and specifically, the p-type semiconductor layer may be p-type GaN, and the n-type semiconductor layer may be N-type GaN. However, in case of the red semiconductor light emitting element, the p-type semiconductor layer may be p-type GaAs and the n-type semiconductor layer may be n-type GaAs.

In addition, a p-electrode side in the p-type semiconductor layer may be p-type GaN doped with Mg, and an n-electrode side in the n-type semiconductor layer may be n-type GaN doped with Si. In this case, the above-described semiconductor light emitting elements may be semiconductor light emitting elements without an active layer.

On the other hand, referring to FIGS. 1 to 4, since the light emitting diode is very small, the display panel may be arranged with self-emitting sub-pixels arranged at fine pitch, thereby implementing a high-quality display device.

In a display device using the semiconductor light emitting element of the present disclosure described above, a semiconductor light emitting element grown on a wafer and formed through mesa and isolation is used as an individual pixel. In this case, the micro-sized semiconductor light emitting element 150 must be transferred to a wafer at a predetermined position on the substrate of the display panel. Pick-and-place is used for the transfer technology, but the success rate is low and a lot of time is required. For another example, there is a technology of transferring a plurality of devices at one time using a stamp or a roll, but the yield is limited and not suitable for a large screen display. The present disclosure proposes a new fabrication method of a display device capable of solving the foregoing problems and a fabrication device using the same.

For this purpose, first, a new fabrication method of the display device will be described. FIGS. 5a to 5e are conceptual views for explaining a new process of manufacturing the foregoing semiconductor light emitting element.

In this specification, a display device using a passive matrix (PM) semiconductor light emitting element is illustrated. However, an example described below may also be applicable to an active-matrix (AM) type semiconductor light emitting element. In addition, a method of self-assembling a horizontal semiconductor light emitting element is illustrated, but it is also applicable to a method of self-assembling a vertical semiconductor light emitting element.

Figure 5A:
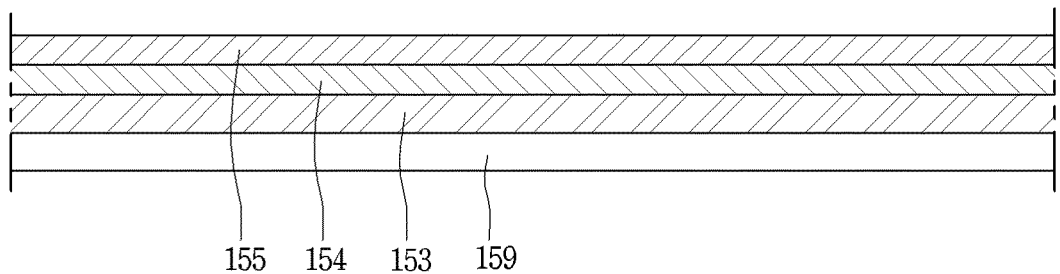
FIGS. 5a to 5e are conceptual views for explaining a new process of manufacturing the foregoing semiconductor light emitting element.

First, according to a manufacturing method, a first conductive semiconductor layer 153, an active layer 154, and a second conductive semiconductor layer 155 are respectively grown on a growth substrate 159 (FIG. 5a).

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5a.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

In addition, the present embodiment illustrates a case where the active layer is present, but it is also possible to adopt a structure in which the active layer is not present as described above. For such an example, the p-type semiconductor layer may be p-type GaN doped with Mg, and an n-electrode side in the n-type semiconductor layer may be n-type GaN doped with Si.

The growth substrate 159 (wafer) may be formed of any one of materials having light transmission properties, for example, sapphire ($Al_2O_3$), GaN, ZnO, and AlO, but is not limited thereto. Furthermore, the growth substrate 1059 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Figure 5B:
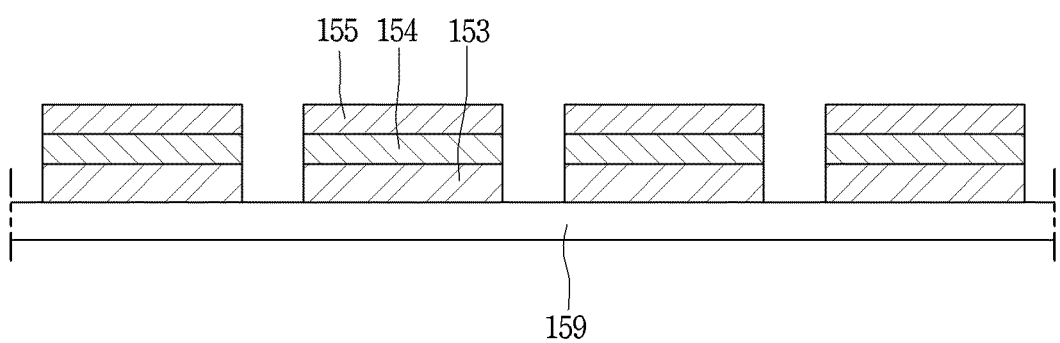

Next, at least part of the first conductive semiconductor layer 153, the active layer 154, and the second conductive semiconductor layer 155 is removed to form a plurality of semiconductor light emitting elements (FIG. 5b).

More specifically, isolation is performed to allow a plurality of light emitting elements form a light emitting element array. In other words, the first conductive semiconductor layer 153, the active layer 154, and the second conductive semiconductor layer 155 are etched in a vertical direction to form a plurality of semiconductor light emitting elements.

If it is a case of forming the horizontal semiconductor light emitting element, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light emitting element arrays.

Figure 5C:
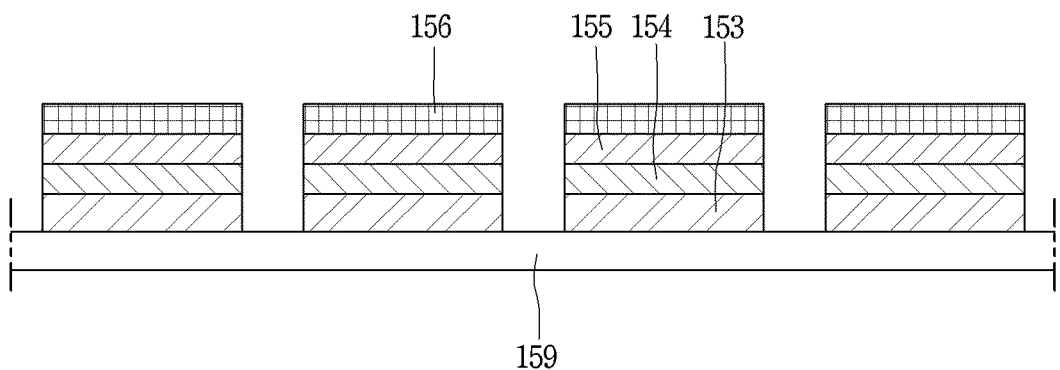

Next, a second conductive electrode 156 (or a p-type electrode) is respectively formed on one surface of the second conductive semiconductor layer 155 (FIG. 5c). The second conductive electrode 156 may be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Figure 5D:
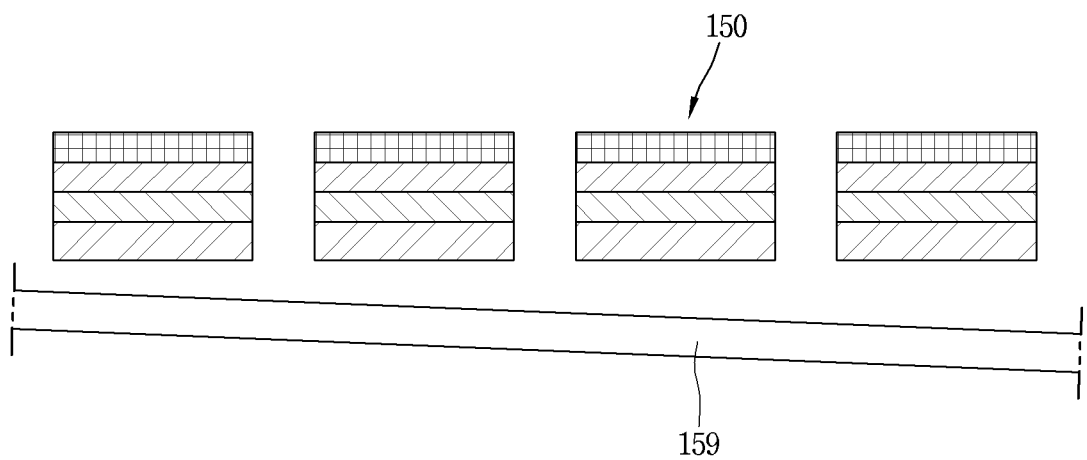

Then, the growth substrate 159 is removed to provide a plurality of semiconductor light emitting elements. For example, the growth substrate 1059 may be removed using a laser lift-off (LLO) or chemical lift-off (CLO) method (FIG. 5d).

Figure 5E:
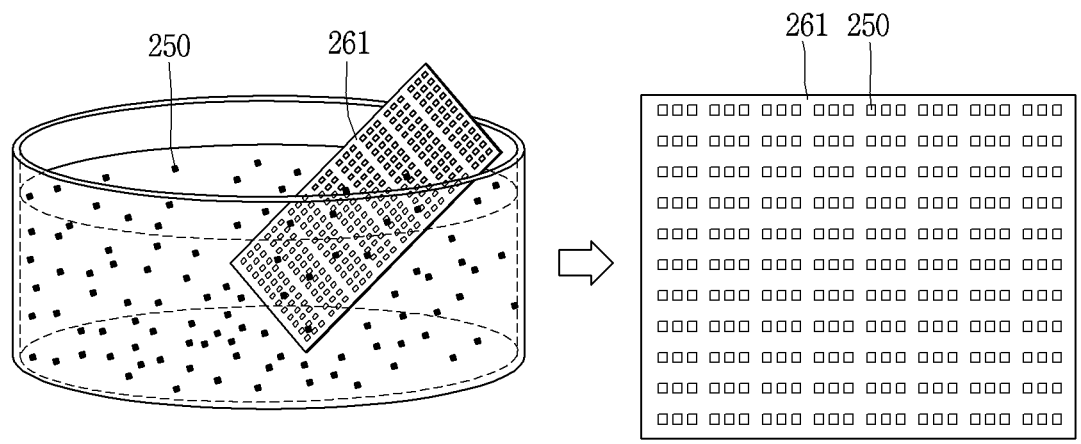

Then, mounting the semiconductor light emitting elements 150 on the substrate in a chamber filled with a fluid is carried out (FIG. 5e).

For example, the semiconductor light emitting elements 150 and the substrate are placed in a chamber filled with a fluid, and the semiconductor light emitting elements are assembled to the substrate 1061 by themselves using flow, gravity, surface tension, or the like. In this case, the substrate may be an assembly substrate 161.

For another example, the wiring substrate may also be placed in the fluid chamber instead of the assembly substrate 161 such that the semiconductor light emitting elements 150 are directly seated on the wiring substrate. In this case, the substrate can be a wiring substrate. However, for convenience of description, in the present disclosure, it is illustrated that the substrate is provided as an assembly substrate 161 and the semiconductor light emitting elements 1050 are seated thereon.

Cells into which the semiconductor light emitting elements 150 are fitted may be provided on the assembly substrate 161 so that the semiconductor light emitting elements 150 are easily seated on the assembly substrate 161. Specifically, cells on which the semiconductor light emitting elements 150 are seated are formed on the assembly substrate 161 at positions where the semiconductor light emitting elements 150 are aligned with the wiring electrodes. The semiconductor light emitting elements 150 are assembled into the cells while moving in the fluid.

When the plurality of semiconductor light emitting elements are arrayed on the assembly substrate 161, and then the semiconductor light emitting elements on the assembly substrate 161 are transferred to the wiring substrate, it may enable large-area transfer. Therefore, the assembly substrate 161 may be referred to as a temporary substrate.

Meanwhile, the self-assembly method described above must increase transfer yield when applied to the fabrication of a large-screen display. The present disclosure proposes a method and apparatus for minimizing the influence of gravity or friction and preventing non-specific binding in order to increase the transfer yield.

In this case, in a display device according to the present disclosure, a magnetic body is disposed on the semiconductor light emitting element to move the semiconductor light emitting element using a magnetic force, and place the semiconductor light emitting element at preset position using an electric field in the movement process. Hereinafter, such a transfer method and device will be described in more detail with reference to the accompanying drawings.

Figure 6:
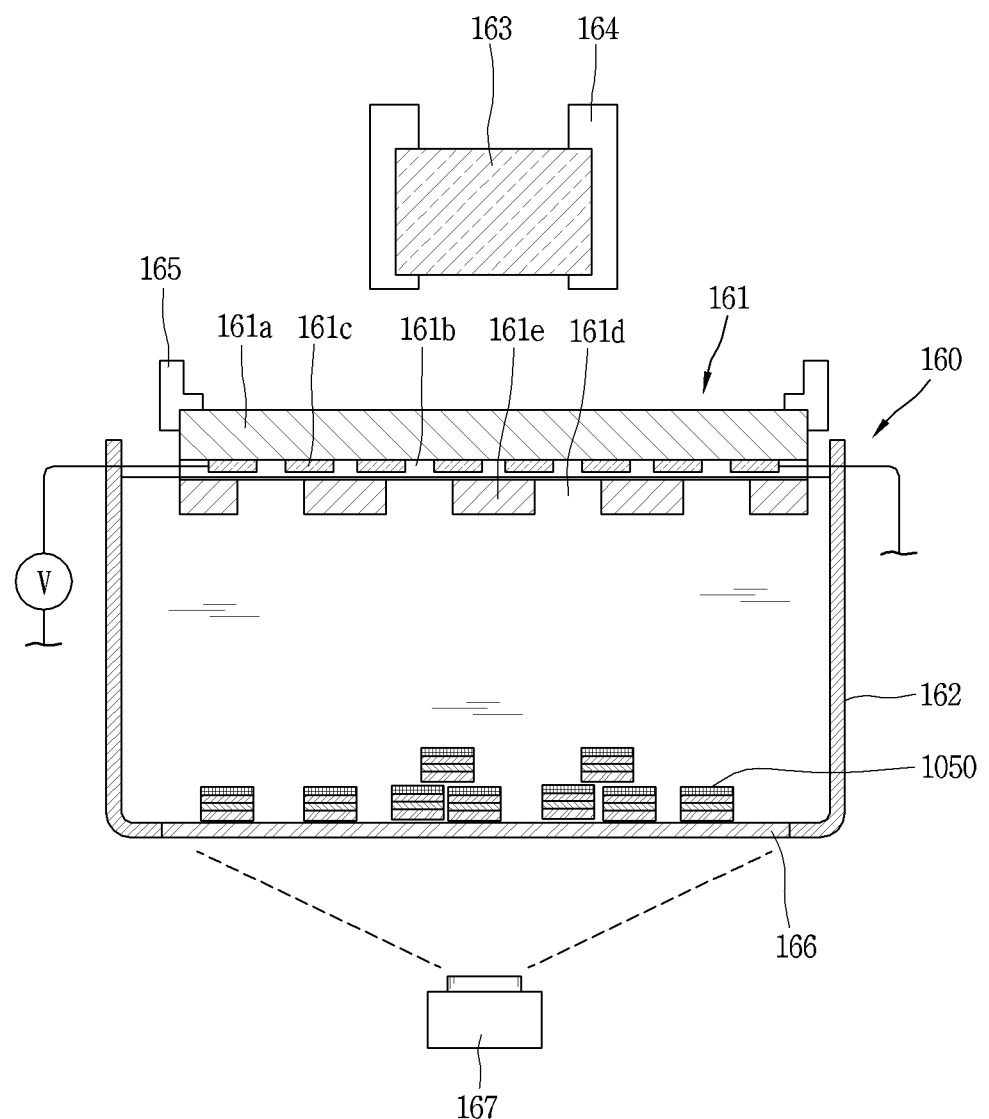
FIG. 6 is a conceptual view showing an example of a self-assembly device of semiconductor light emitting elements according to the present disclosure.
Figure 7:
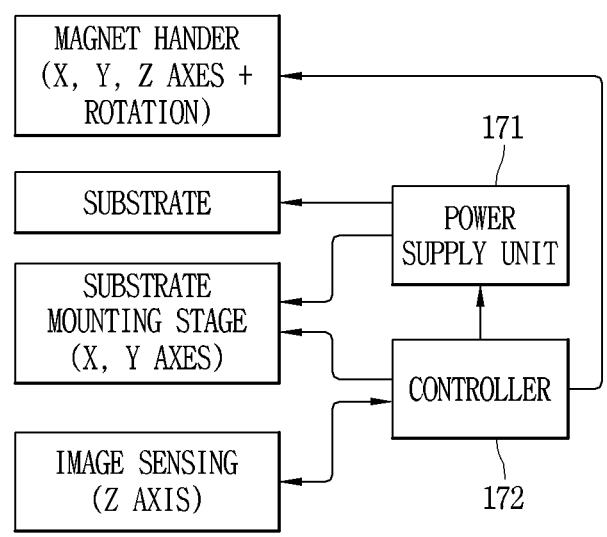
FIG. 7 is a block diagram showing the self-assembly device in FIG. 6.

FIG. 6 is a conceptual view showing an example of a self-assembly device of semiconductor light emitting elements according to the present disclosure, and FIG. 7 is a block diagram showing the self-assembly device in FIG. 6. FIGS. 8a to 8e are conceptual views showing a process of self-assembling semiconductor light emitting elements using the self-assembly device in FIG. 6, and FIG. 9 is a conceptual view for explaining the semiconductor light emitting element in FIGS. 8a to 8e.

According to the illustration of FIGS. 6 and 7, a self-assembly device 160 of the present disclosure may include a fluid chamber 162, a magnet 163, and a location controller 164.

The fluid chamber 162 has a space for accommodating a plurality of semiconductor light emitting elements. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The substrate 161 may be disposed on the fluid chamber 162 such that an assembly surface on which the semiconductor light emitting elements 150 are assembled faces downward. For example, the substrate 161 may be transferred to an assembly position by a transfer unit, and the transfer unit may include a stage 165 on which the substrate is mounted. The stage 165 is positioned by the controller, and the substrate 161 may be transferred to the assembly position through the stage 165.

At this time, the assembly surface of the substrate 161 faces the bottom of the fluid chamber 150 at the assembly position. According to the illustration, the assembly surface of the substrate 161 is disposed so as to be immersed in a fluid in the fluid chamber 162. Therefore, the semiconductor light emitting elements 150 are moved to the assembly surface in the fluid.

The substrate 161, which is an assembly substrate on which an electric field can be formed, may include a base portion 161a, a dielectric layer 161b and a plurality of electrodes 161c.

The base portion 161a may be made of an insulating material, and the plurality of electrodes 161c may be a thin or a thick film bi-planar electrode patterned on one side of the base portion 161a. The electrode 161c may be formed of, for example, a stack of Ti/Cu/Ti, an Ag paste, ITO, and the like.

The dielectric layer 161b is made of an inorganic material such as $SiO_2$, $SiN_x$, SiON, $Al_2O_3$, $TiO_2$, $HfO_2$, or the like. Alternatively, the dielectric layer 161b may be composed of a single layer or multiple layers as an organic insulator. A thickness of the dielectric layer 161b may be several tens of nanometers to several micrometers.

Furthermore, the substrate 161 according to the present disclosure includes a plurality of cells 161d partitioned by partition walls. The cells 161d may be sequentially arranged along one direction, and made of a polymer material. In addition, the partition wall 161e constituting the cells 161d is configured to be shared with neighboring cells 161d. The partition walls 161e are protruded from the base portion 161a, and the cells 161d may be sequentially arranged along the one direction by the partition walls 161e. More specifically, the cells 161d are sequentially arranged in row and column directions, and may have a matrix structure.

As shown in the drawing, an inside of the cells 161d has a groove for accommodating the semiconductor light emitting element 150, and the groove may be a space defined by the partition walls 161e. The shape of the groove may be the same as or similar to that of the semiconductor light emitting element. For example, when the semiconductor light emitting element is in a rectangular shape, the groove may be a rectangular shape. In addition, although not shown, when the semiconductor light emitting element is circular, the grooves formed in the cells may be formed in a circular shape. Moreover, each of the cells is configured to accommodate a single semiconductor light emitting element. In other words, a single semiconductor light emitting element is accommodated in a single cell.

Meanwhile, the plurality of electrodes 161c include a plurality of electrode lines disposed at the bottom of each of the cells 161d, and the plurality of electrode lines may be configured to extend to neighboring cells.

The plurality of electrodes 161c are disposed below the cells 161d and applied with different polarities to generate an electric field in the cells 161d. In order to form the electric field, the dielectric layer may form the bottom of the cells 161d while the dielectric layer covers the plurality of electrodes 161c. In such a structure, when different polarities are applied to a pair of electrodes 161c from a lower side of each cell 161d, an electric field may be formed, and the semiconductor light emitting element may be inserted into the cells 161d by the electric field.

At the assembly position, the electrodes of the substrate 161 are electrically connected to the power supply unit 171. The power supply unit 171 applies power to the plurality of electrodes to generate the electric field.

According to the illustration, the self-assembly device may include a magnet 163 for applying a magnetic force to the semiconductor light emitting elements. The magnet 163 is spaced apart from the fluid chamber 162 to apply a magnetic force to the semiconductor light emitting elements 150. The magnet 163 may be disposed to face an opposite side of the assembly surface of the substrate 161, and the location of the magnet is controlled by the location controller 164 connected to the magnet 163.

The semiconductor light emitting element 1050 may have a magnetic body so as to move in the fluid by the magnetic field of the magnet 163.

Referring to FIG. 9, the semiconductor light emitting element of the display device having a magnetic body may include a first conductive electrode 1052 and a second conductive electrode 1056, a first conductive semiconductor layer 1053 disposed with the first conductive electrode 1052, a second conductive semiconductor layer 1055 configured to overlap with the first conductive semiconductor layer 1052, and disposed with the second conductive electrode 1056, and an active layer 1054 disposed between the first and second conductive semiconductor layers 1053 and 1055, respectively.

Here, the first conductive type and the second conductive type may be composed of p-type and n-type, and vice versa. In addition, as described above, it may be a semiconductor light emitting element without having the active layer.

Meanwhile, in the present disclosure, the first conductive electrode 1052 may be generated after the semiconductor light emitting element is assembled to the wiring board by the self-assembly of the semiconductor light emitting element. In addition, in the present disclosure, the second conductive electrode 1056 may include the magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light emitting element 1050 may include a first layer 1056a and a second layer 1056b. Here, the first layer 1056a may be made to include a magnetic material, and the second layer 1056b may include a metal material other than the magnetic material.

As illustrated, in this example, the first layer 1056a including a magnetic body may be disposed to be in contact with the second conductive semiconductor layer 1055. In this case, the first layer 1056a is disposed between the second layer 1056b and the second conductive semiconductor layer 1055. The second layer 1056b may be a contact metal connected to the second electrode of the wiring substrate. However, the present disclosure is not necessarily limited thereto, and the magnetic body may be disposed on one surface of the first conductive semiconductor layer.

Referring again to FIGS. 6 and 7, more specifically, the self-assembly device may include a magnet handler that can be automatically or manually moved in the x, y, and z axes on the top of the fluid chamber or include a motor capable of rotating the magnet 163. The magnet handler and the motor may constitute the location controller 164. Through this, the magnet 163 rotates in a horizontal direction, a clockwise direction, or a counterclockwise direction with respect to the substrate 161.

On the other hand, a light transmitting bottom plate 166 may be formed in the fluid chamber 162, and the semiconductor light emitting elements may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembling apparatus described above is configured to use a combination of a magnetic field and an electric field, and using those fields, the semiconductor light emitting elements may be placed at preset positions of the substrate by an electric field in the process of being moved by a location change of the magnet. Hereinafter, an assembly process using the self-assembly device described above will be described in more detail.

First, a plurality of semiconductor light emitting elements 1050 having magnetic bodies are formed through the process described with reference to FIGS. 5a to 5c. In this case, a magnetic body may be deposited on the semiconductor light emitting element in the process of forming the second conductive electrode in FIG. 5c.

Figure 8A:
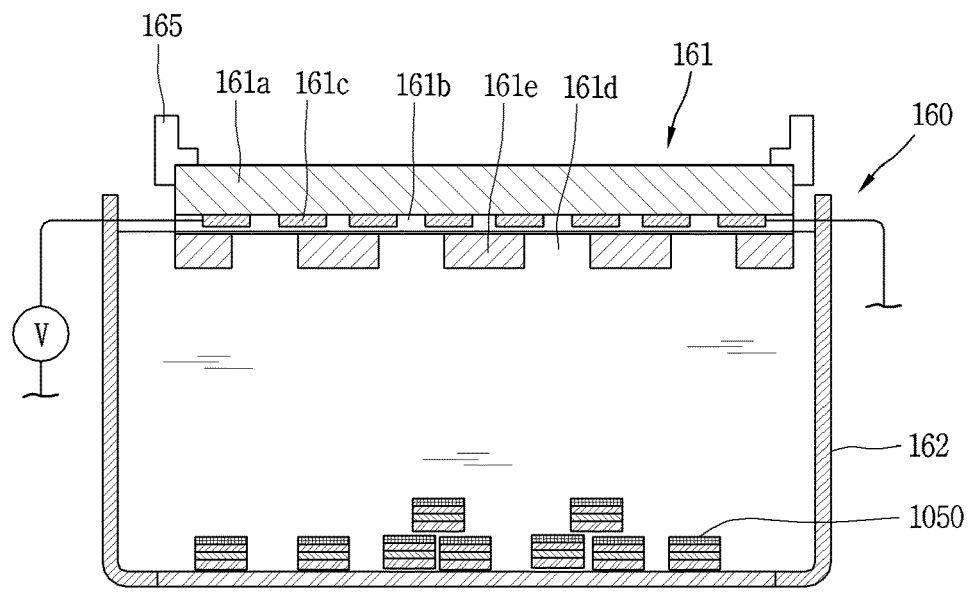
FIGS. 8a to 8e are conceptual views showing a step of self-assembling semiconductor light emitting elements using the self-assembly device in FIG. 6.
Figure 9:
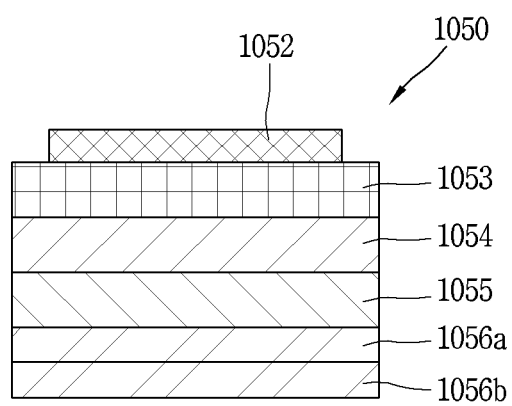
FIG. 9 is a conceptual view for explaining the semiconductor light emitting element in FIGS. 8A to 8E.

Next, the substrate 161 is transferred to the assembly position, and the semiconductor light emitting elements 1050 are placed into the fluid chamber 162 (FIG. 8a).

As described above, the assembly position of the substrate 161 is a position at which the assembly surface on which the semiconductor light emitting elements 1050 of the substrate 161 are assembled is disposed in a downward direction in the fluid chamber 162.

In this case, some of the semiconductor light emitting elements 1050 may sink to the bottom of the fluid chamber 162 and some may float in the fluid. When the light transmitting bottom plate 166 is provided in the fluid chamber 162, some of the semiconductor light emitting elements 1050 may sink to the bottom plate 166.

Figure 8B:
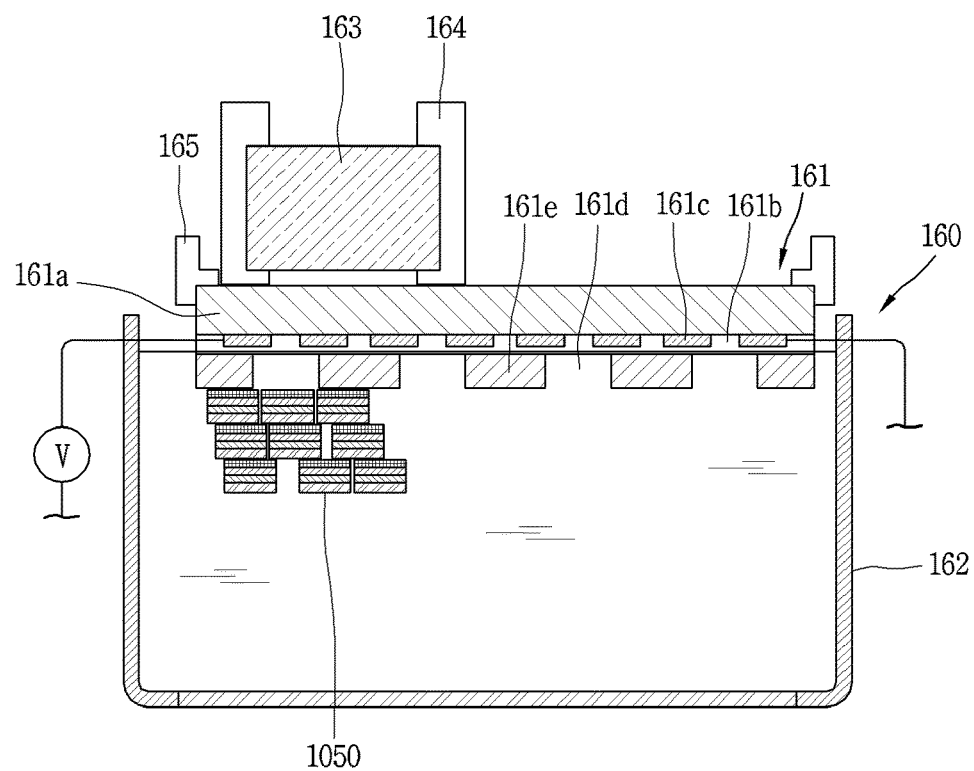

Next, a magnetic force is applied to the semiconductor light emitting elements 1050 so that the semiconductor light emitting elements 1050 float in the fluid chamber 162 in a vertical direction (FIG. 8b).

When the magnet 163 of the self-assembly device moves from its original position to an opposite side of the assembly surface of the substrate 161, the semiconductor light emitting elements 1050 float in the fluid toward the substrate 161. The original position may be a position away from the fluid chamber 162. For another example, the magnet 163 may be composed of an electromagnet. In this case, electricity is supplied to the electromagnet to generate an initial magnetic force.

Meanwhile, in this example, a separation distance between the assembly surface of the substrate 161 and the semiconductor light emitting elements 1050 may be controlled by adjusting the magnitude of the magnetic force. For example, the separation distance is controlled using the weight, buoyancy, and magnetic force of the semiconductor light emitting elements 1050. The separation distance may be several millimeters to tens of micrometers from the outermost edge of the substrate.

Figure 8C:
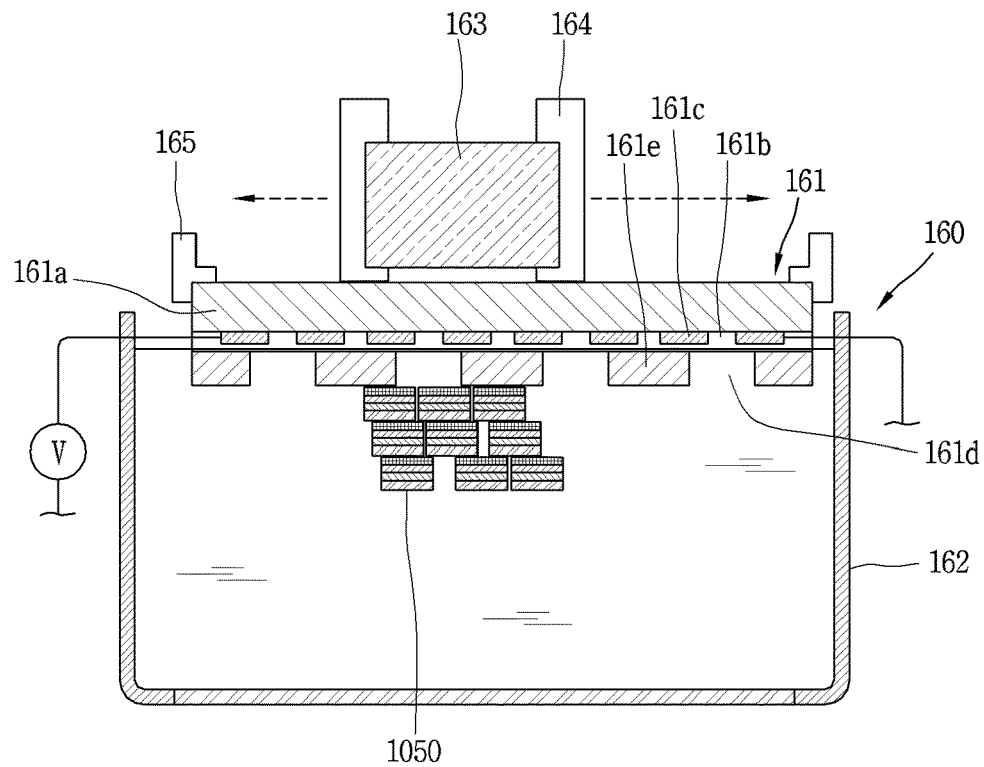

Next, a magnetic force is applied to the semiconductor light emitting elements 1050 so that the semiconductor light emitting elements 1050 move in one direction in the fluid chamber 162. For example, the magnet 163 moves in a horizontal direction, a clockwise direction or a counterclockwise direction with respect to the substrate (FIG. 8c). In this case, the semiconductor light emitting elements 1050 move in a direction parallel to the substrate 161 at a position spaced apart from the substrate 161 by the magnetic force.

Next, applying an electric field to guide the semiconductor light emitting elements 1050 to preset positions of the substrate 161 so as to allow the semiconductor light emitting elements 1050 to be seated at the preset positions during the movement of the semiconductor light emitting elements 250 is carried out (FIG. 8c). For example, the semiconductor light emitting elements 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to guide assembly only at preset positions using the electric field. In other words, the semiconductor light emitting elements 1050 are assembled to the assembly position of the substrate 161 using a selectively generated electric field. For this purpose, the substrate 161 may include cells in which the semiconductor light emitting elements 1050 are inserted.

Then, the unloading process of the substrate 161 is carried out, and the assembly process is completed. When the substrate 161 is an assembly substrate, a post-process of transferring the aligned semiconductor light emitting elements to a wiring substrate as described above to implement a display device may be carried out.

Figure 8D:
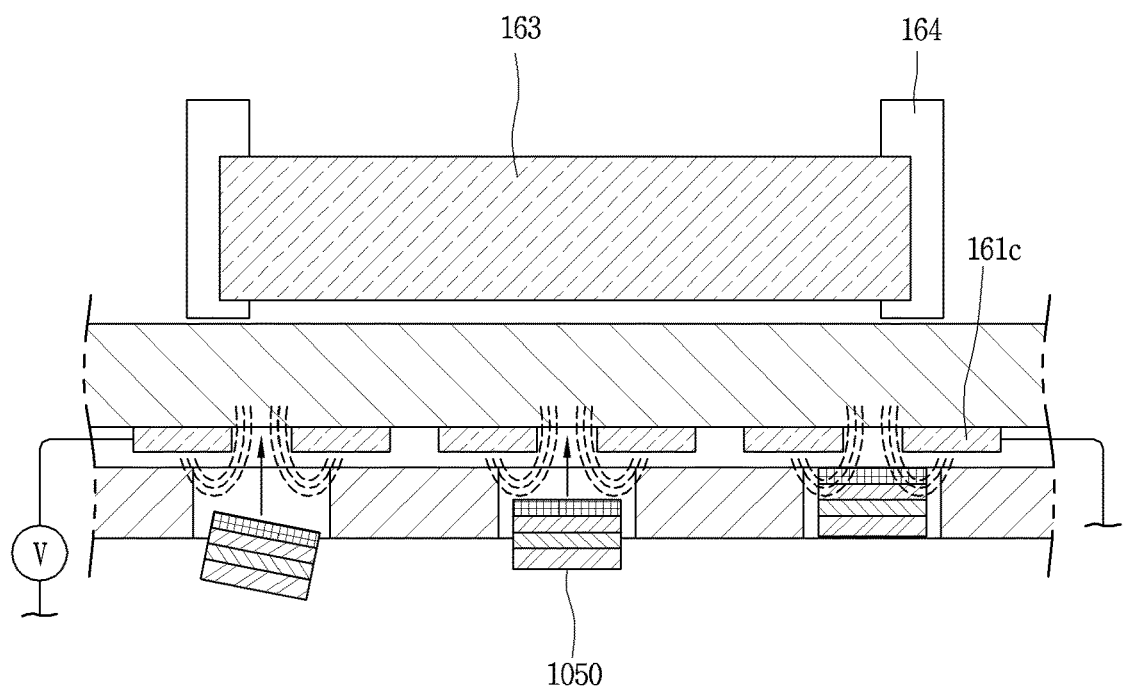
Figure 8E:
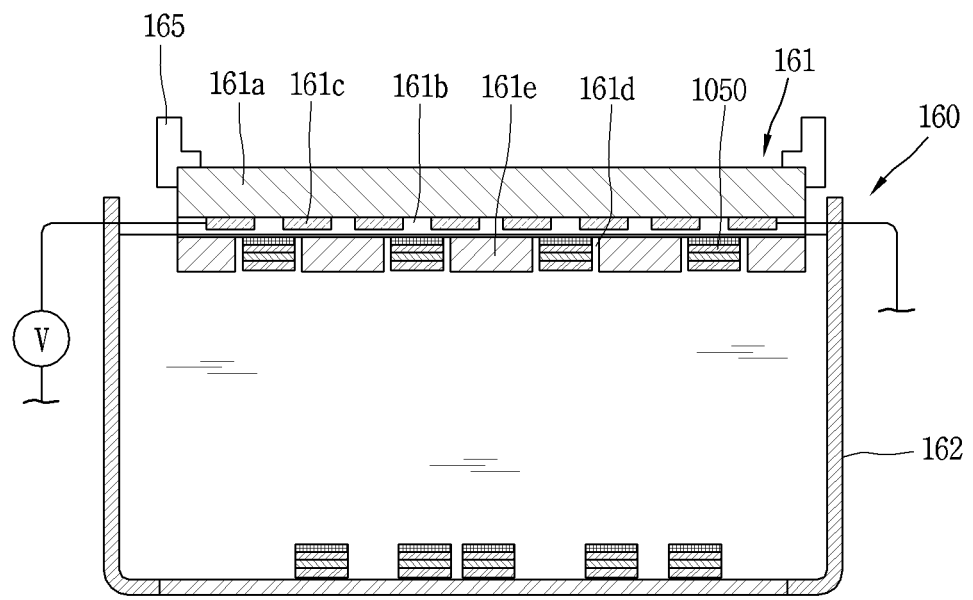

On the other hand, the semiconductor light emitting elements 1050 may be guided to the preset positions, then the magnet 163 may move in a direction away from the substrate 161 such that the semiconductor light emitting elements 1050 remaining in the fluid chambers 162 fall to the bottom of the fluid chambers 162, (FIG. 8d). For another example, if power supply is stopped when the magnet 163 is an electromagnet, then the semiconductor light emitting elements 1050 remaining in the fluid chamber 162 fall to the bottom of the fluid chamber 162.

Then, when the semiconductor light emitting elements 1050 on the bottom of the fluid chamber 162 are collected, the collected semiconductor light emitting elements 1050 may be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

As described above, according to the present disclosure having the foregoing configuration, a large number of semiconductor light emitting elements may be assembled at one time in a display device in which individual pixels are formed with semiconductor light emitting elements.

As described above, according to the present disclosure, a large number of semiconductor light emitting elements may be pixelated on a wafer having a small size, and then transferred onto a large-area substrate. Through this, it may be possible to fabricate a large-area display device at a low cost.

Meanwhile, the present disclosure provides a structure and method of an assembling substrate for increasing a yield of the foregoing self-assembly process and a yield subsequent to the self-assembly process. The present disclosure is limited to when the substrate 161 is used as an assembly substrate. In other words, the assembly substrate to be described later is not used as a wiring substrate of a display device. Thus, hereinafter, the substrate 161 is referred to as an assembly substrate 161.

The present disclosure improves process yield from two perspectives. First, in the present disclosure, a strong electric field is formed to prevent a semiconductor light emitting element from being seated in an undesired position due to a strong electric field formed in an undesired position. Second, the present disclosure prevents a semiconductor light emitting element from remaining on the assembly substrate when transferring the semiconductor light emitting elements seated on the assembly substrate to another substrate.

The foregoing solutions are not individually achieved by different components. The foregoing two solutions may be achieved by organically combining components to be described later with the assembly substrate 161 described above.

Prior to describing the present disclosure in detail, a post process for manufacturing a display device subsequent to self-assembly will be described.

Figure 10A:
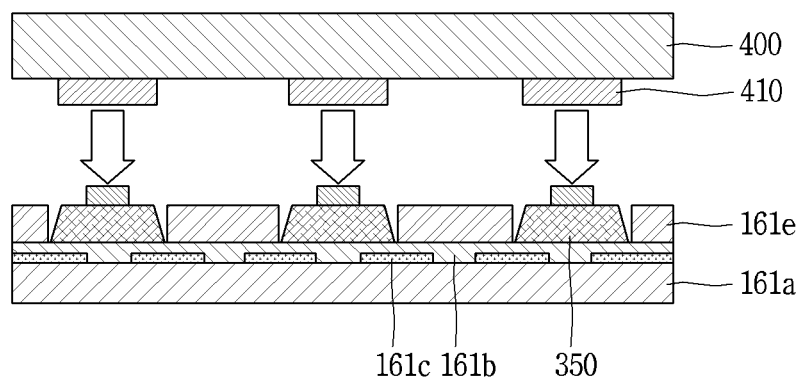
FIGS. 10a to 10c are conceptual views showing a state in which semiconductor light emitting elements are transferred subsequent to a self-assembly process according to the present disclosure.
Figure 10B:
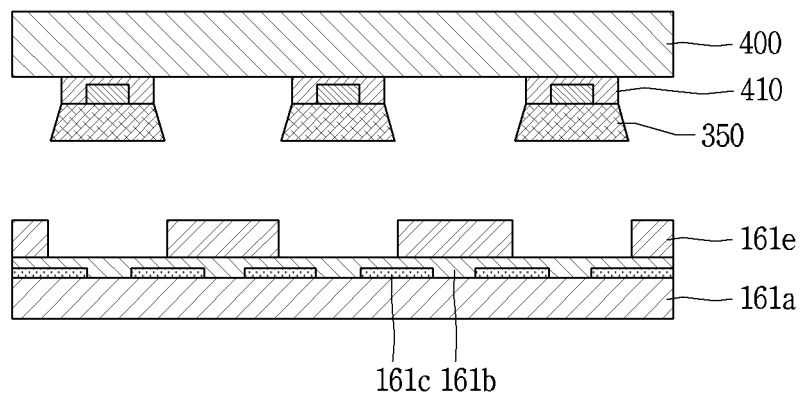
Figure 10C:
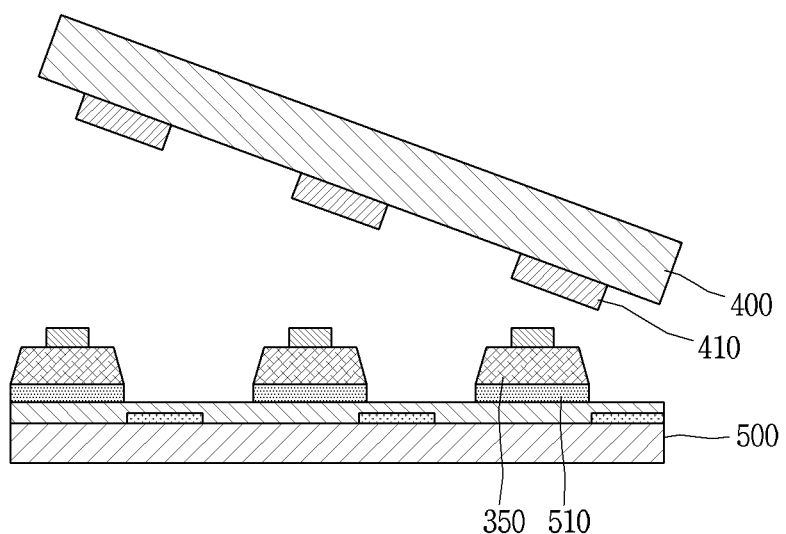

FIGS. 10a to 10c are conceptual views showing a state in which semiconductor light emitting elements are transferred subsequent to a self-assembly process according to the present disclosure.

When the self-assembly process described with reference to FIGS. 8a to 8e is completed, the semiconductor light emitting elements are seated at preset positions of the assembly substrate 161. The semiconductor light emitting elements seated on the assembly substrate 161 are transferred to another substrate at least once. In the present specification, an embodiment in which the semiconductor light emitting elements seated on the assembly substrate 161 are transferred twice, but the present disclosure is not limited thereto, and the semiconductor light emitting elements seated on the assembly substrate 161 may be transferred to another substrate once or more than three times.

On the other hand, immediately after the self-assembly process is finished, an assembly surface of the assembly substrate 161 is in a state in which the assembly surface faces downward (or a gravity direction). For a process subsequent to self-assembly, the assembly substrate 161 may be turned over 180 degrees while the semiconductor light emitting element is seated. In this process, since there is a risk that the semiconductor light emitting element may be released from the assembly substrate 161, a voltage must be applied to the plurality of electrodes 161c (hereinafter, assembly electrodes) while the assembly substrate 161 is turned over. An electric field formed between the assembly electrodes prevents the semiconductor light emitting element from being released from the assembly substrate 161 while the assembly substrate 161 is turned over.

Subsequent to the self-assembly process, when the assembly substrate 161 is turned over 180 degrees, it becomes a shape as shown in FIG. 10a. Specifically, as shown in FIG. 10a, the assembly surface of the assembly substrate 161 is in a state that faces upward (or a direction opposite to gravity). In this state, a transfer substrate 400 is aligned on an upper side of the assembly substrate 161.

The transfer substrate 400 is a substrate for transferring the semiconductor light emitting elements seated on the assembly substrate 161 to a wiring substrate by releasing them. The transfer substrate 400 may be formed of a PDMS (polydimethylsiloxane) material. Therefore, the transfer substrate 400 may be referred to as a PDMS substrate.

The transfer substrate 400 is aligned with the assembly substrate 161 and then pressed onto the assembly substrate 161. Then, when the transfer substrate 400 is transferred to an upper side of the assembly substrate 161, the semiconductor light emitting elements 350 disposed on the assembly substrate 161 due to an adhesive force of the transfer substrate 400 are moved to the transfer substrate 400.

To this end, surface energy between the semiconductor light emitting element 350 and the transfer substrate 400 must be higher than that between the semiconductor light emitting element 350 and the dielectric layer 161b. The probability of releasing the semiconductor light emitting element 350 from the assembly substrate 161 increases as a difference between surface energy between the semiconductor light emitting element 350 and the transfer substrate 400 and surface energy between the semiconductor light emitting element 350 and the dielectric layer 161b increases, and thus a larger difference between the two surface energies is preferable.

Meanwhile, the transfer substrate 400 may include a plurality of protruding portions 410 to allow a pressure applied by the transfer substrate 400 to be concentrated on the semiconductor light emitting element 350 when the transfer substrate 400 is pressed against the assembly substrate 161. The protruding portions 410 may be formed at the same interval as the semiconductor light emitting elements seated on the assembly substrate 161. When the protruding portions 410 are aligned to overlap with the semiconductor light emitting elements 350 and then the transfer substrate 400 is pressed against the assembly substrate 161, a pressure by the transfer substrate 400 may be concentrated on the semiconductor light emitting elements 350. Through this, the present disclosure increases the probability that the semiconductor light emitting element is released from the assembly substrate 161.

Meanwhile, while the semiconductor light emitting elements are seated on the assembly substrate 161, part of the semiconductor light emitting elements may be preferably exposed to an outside of the groove. When the semiconductor light emitting elements 350 are not exposed to an outside of the groove, a pressure by the transfer substrate 400 is not concentrated on the semiconductor light emitting elements 350, thereby reducing the probability of releasing the semiconductor light emitting elements 350 from the assembly substrate 161

Finally, referring to FIG. 10c, pressing the transfer substrate 400 to a wiring substrate 500 to transfer the semiconductor light emitting elements 350 from the transfer substrate 400 to the wiring substrate 500 is carried out. At this time, a protruding portion 510 may be formed on the wiring substrate 500. The transfer substrate 400 and the wiring substrate 500 are aligned so that the semiconductor light emitting elements 350 disposed on the transfer substrate 400 overlap with the protruding portion 510. Then, when the transfer substrate 400 and the wiring substrate 500 are pressed, the probability of releasing the semiconductor light emitting elements 350 from the transfer substrate 400 due to the protruding portion 510 may increase.

Meanwhile, in order for the semiconductor light emitting elements 350 disposed on the transfer substrate 400 to be transferred to the wiring substrate 500, surface energy between the semiconductor light emitting element 350 and the wiring substrate 500 must be higher than that between semiconductor light emitting elements 350 and the transfer substrate 400. The probability of releasing the semiconductor light emitting element 350 from the transfer substrate 400 increases as a difference between surface energy between the semiconductor light emitting element 350 and the wiring substrate 500 and surface energy between the semiconductor light emitting element 350 and the transfer substrate 400 increases, and thus a larger difference between the two surface energies is preferable.

Subsequent to transferring all of the semiconductor light emitting elements 350 disposed on the transfer substrate 400 to the wiring substrate 500, forming an electrical connection between the semiconductor light emitting elements 350 and the wiring electrodes formed on the wiring substrate 500 may be carried out. A structure of the wiring electrode and a method of forming an electrical connection may vary depending on the type of the semiconductor light emitting elements 350.

Meanwhile, although not shown, an anisotropic conductive film may be disposed on the wiring substrate 500. In this case, an electrical connection may be formed between the semiconductor light emitting elements 350 and the wiring electrodes formed on the wiring substrate 500 only by pressing the transfer substrate 400 and the wiring substrate 500.

Meanwhile, when manufacturing a display device including semiconductor light emitting elements emitting different colors, the methods described with reference to FIGS. 10a to 10c may be implemented in various ways. Hereinafter, a method of manufacturing a display device including semiconductor light emitting elements emitting red (R), green (G), and blue (B) will be described.

Figure 11:
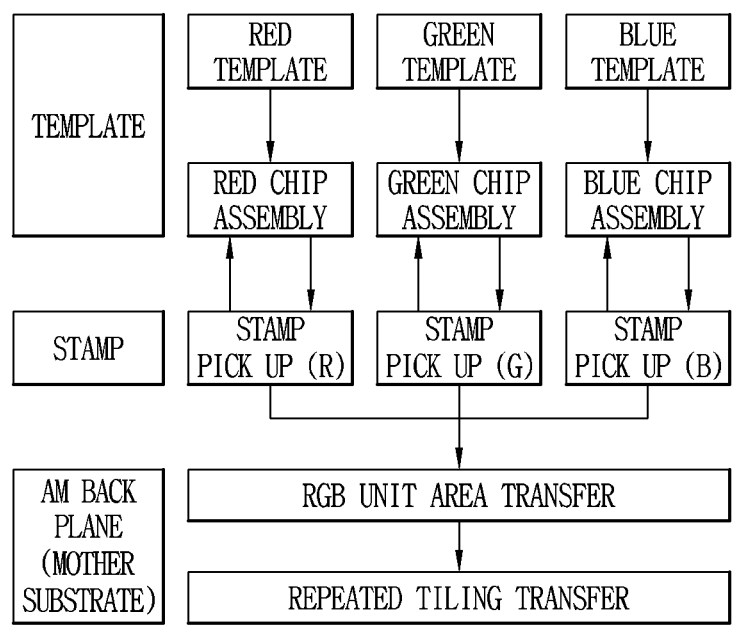
FIGS. 11 to 13 are flowcharts showing a method of manufacturing a display device including semiconductor light emitting elements emitting red (R), green (G), and blue (B) light.
Figure 12:
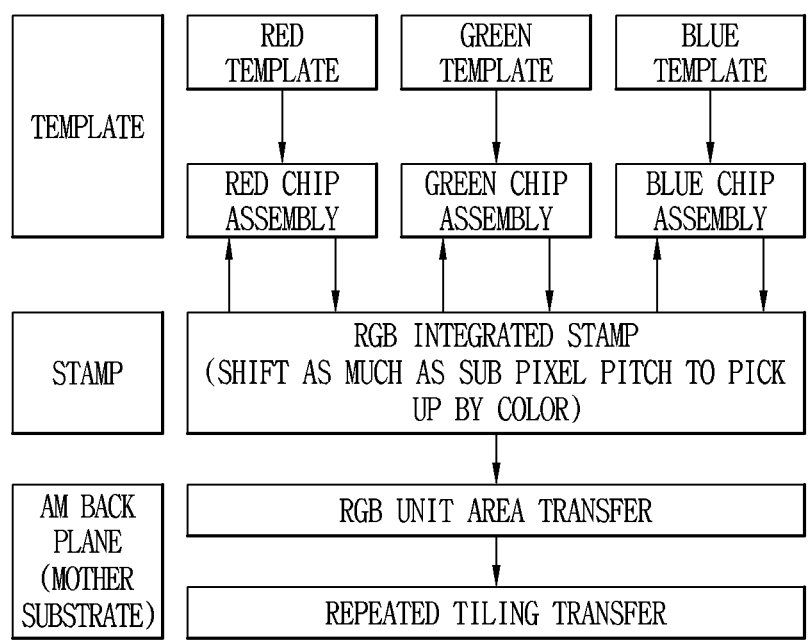
Figure 13:
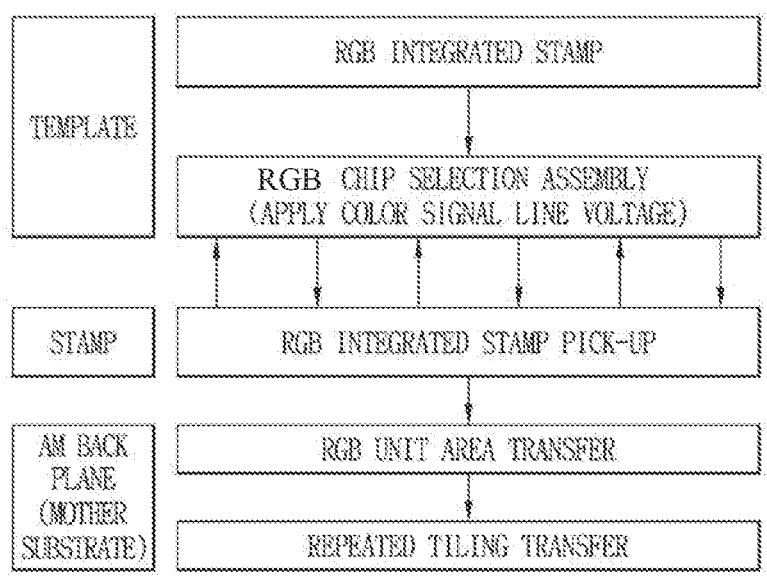

FIGS. 11 to 13 are flowcharts showing a method of manufacturing a display device including semiconductor light emitting elements emitting red (R), green (G), and blue (B) light.

Semiconductor light emitting elements emitting different colors may be individually assembled on different assembly substrates. Specifically, the assembly substrate 161 may include a first assembly substrate on which semiconductor light emitting elements emitting a first color are seated, a second assembly substrate on which semiconductor light emitting elements emitting a second color different from the first color are seated, and a third assembly substrate on which semiconductor light emitting elements emitting a third color different from the first color and the second color are seated. Different types of semiconductor light emitting elements are assembled on each assembly substrate according to the method described with reference to FIGS. 8a to 8e. For example, semiconductor light emitting elements emitting red (R), green (G), and blue (B) light, respectively, may be respectively assembled on first to third assembly substrates.

Referring to FIG. 11, each of a red chip, a green chip, and a blue chip may be assembled on each of first to third assembly substrates (a red template, a green template, and a blue template). In this state, each of the red, green, and blue chips may be transferred to a wiring substrate by a different transfer substrate.

Specifically, transferring semiconductor light emitting elements seated on an assembly substrate to a wiring substrate includes pressing a first transfer substrate (stamp (R)) on the first assembly substrate (red template) to transfer semiconductor light emitting elements (red chips) that emit the first color from the first assembly substrate (red template) to the first transfer substrate (stamp (R)), pressing a second transfer substrate (stamp (G)) on the second assembly substrate (green template) to transfer semiconductor light emitting elements (green chips) that emit the second color from the second assembly substrate (green template) to the second transfer substrate (stamp (G)), and pressing a third transfer substrate (stamp (B)) on the third assembly substrate (blue template) to transfer semiconductor light emitting elements (blue chips) that emit the third color from the third assembly substrate (blue template) to the third transfer substrate (stamp (B)).

Thereafter, pressing the first to third transfer substrates to the wiring substrate, respectively, and transferring the semiconductor light emitting elements that emit the first to third colors from the first to third transfer substrates, respectively, to the wiring substrate is carried out.

According to the manufacturing method of FIG. 11, in order to manufacture a display device including a red chip, a green chip, and a blue chip, three types of assembly substrates and three types of transfer substrates may be required.

On the contrary, referring to FIG. 12, each of a red chip, a green chip, and a blue chip may be assembled on each of first to third assembly substrates (a red template, a green template, and a blue template). In this state, each of the red, green, and blue chips may be transferred to a wiring substrate by the same transfer substrate.

Specifically, transferring semiconductor light emitting elements seated on the assembly substrate to a wiring substrate includes pressing a transfer substrate (RGB integrated stamp) on the first assembly substrate (red template) to transfer semiconductor light emitting elements (red chips) that emit the first color from the first assembly substrate (red template) to the transfer substrate (RGB integrated stamp), pressing the transfer substrate (RGB integrated stamp) on the second assembly substrate (green template) to transfer semiconductor light emitting elements (green chips) that emit the second color from the second assembly substrate (green template) to the transfer substrate (RGB integrated stamp), and pressing the transfer substrate (RGB integrated stamp) on the third assembly substrate (blue template) to transfer semiconductor light emitting elements (blue chips) that emit the third color from the third assembly substrate (blue template) to the transfer substrate (RGB integrated stamp).

In this case, alignment positions between each of the first to third assembly substrates and the transfer substrate may be different from each other. For example, when alignment between the assembly substrate and the transfer substrate is completed, a relative position of the transfer substrate with respect to the first assembly substrate and a relative position of the transfer substrate with respect to the second assembly substrate may be different from each other. The transfer substrate may shift the alignment positions by a pitch of the sub-pixel whenever the type of assembly substrate is changed. When the transfer substrate is sequentially pressed onto the first to third assembly substrates through the foregoing method, all three types of chips may be transferred to the transfer substrate.

Then, as shown in FIG. 11, a process of pressing the transfer substrate to the wiring substrate to transfer the semiconductor light emitting elements emitting first to third colors from the transfer substrate to the wiring substrate is carried out.

According to the manufacturing method of FIG. 12, in order to manufacture a display device including a red chip, a green chip, and a blue chip, three types of assembly substrates and a single type of transfer substrate may be required.

Contrary to FIGS. 11 and 12 described above, according to FIG. 13, a red chip, a green chip, and a blue chip may be respectively assembled on one assembly substrate (RGB integrated template). In this state, the red chip, green chip, and blue chip may be respectively transferred to the wiring substrate by the same transfer substrate (RGB integrated stamp).

According to the manufacturing method of FIG. 13, in order to manufacture a display device including a red chip, a green chip, and a blue chip, a single type of assembly substrate and a single type of transfer substrate may be required.

When manufacturing a display device including semiconductor light emitting elements emitting different colors as described above, the manufacturing method may be implemented in various ways.

The present disclosure provides a method of manufacturing a new display device in a method of assembling semiconductor light emitting elements on an assembly substrate and then transferring the semiconductor light emitting elements to a wiring substrate.

Figure 14:
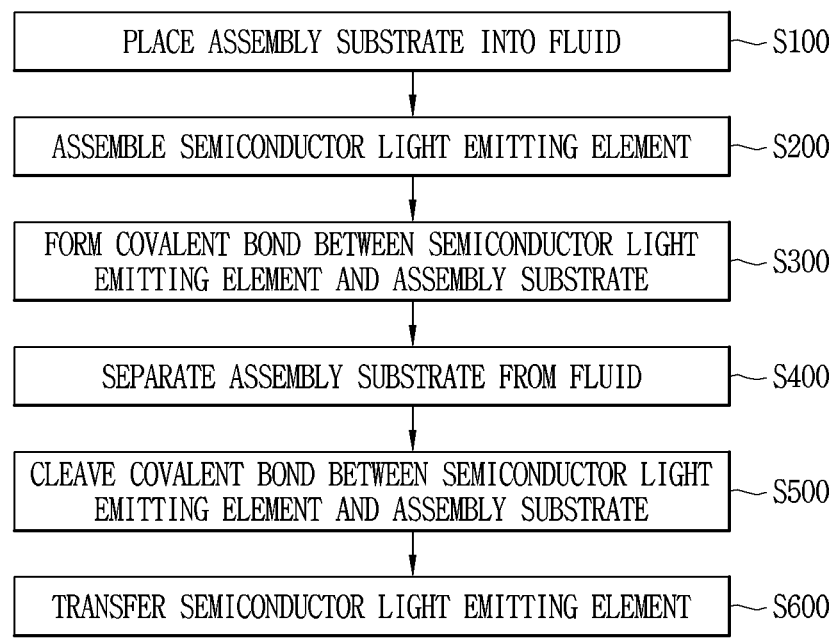
FIG. 14 is a flowchart showing a method of manufacturing a display device according to an embodiment of the present disclosure.

FIG. 14 is a flowchart showing a method of manufacturing a display device according to an embodiment of the present disclosure. Referring to FIG. 14, a method of manufacturing a display device according to an embodiment of the present disclosure may include forming a covalent bond between a semiconductor light emitting element 1050 and an assembly substrate 1000 and cleaving the formed covalent bond.

Hereinafter, the method of manufacturing a display device according to an embodiment of the present disclosure will be described in detail.

According to the method of manufacturing a display device according to an embodiment of the present disclosure, the semiconductor light emitting elements 1050 placed into a chamber containing a fluid may be seated at preset positions of the assembly substrate 1000 using electric and magnetic fields. Such a method of assembling the semiconductor light emitting element 1050 is called self-assembly.

Here, the assembly substrate 1000 may denote a substrate on which the semiconductor light emitting elements 1050 are temporarily seated, including assembly electrodes 1020, and may not include wiring electrodes electrically connected to the semiconductor light emitting elements 1050.

The assembly substrate 1000 may include a base portion 1010 on which assembly electrodes 1020 are disposed, a dielectric layer 1030 deposited on the base portion 1010 to cover the assembly electrodes 1020, and a partition wall 1040 deposited on the dielectric layer 1030 while forming a cell (or a preset position) in which the semiconductor light emitting element 1050 is seated along an extension direction of the assembly electrode 1020 to overlap with part of the assembly electrode 1020.

Since the structure and material of the assembly substrate 1000 are the same as those described above, and thus a description thereof will be omitted.

According to an embodiment of the present disclosure, first, placing the assembly substrate 1000 including the assembly electrodes 1020 into a chamber containing a fluid (S100) may be performed. In this case, one surface (or a surface of the assembly substrate 1000) including the assembly electrodes 1020 may be disposed to face a bottom surface of the chamber.

The self-assembly of the semiconductor light emitting element 1050 may be carried out in a state in which the assembly substrate 1000 is immersed in a fluid, and may be carried in a direction opposite to gravity based on a movement direction of the semiconductor light emitting elements 1050.

Meanwhile, before the assembly substrate 1000 is disposed therein, the semiconductor light emitting elements 1050 may be placed into the fluid in the chamber.

In an embodiment, the semiconductor light emitting elements 1050 placed into the fluid may be blue semiconductor light emitting elements that emit light of the same color, for example, blue.

In another embodiment, the semiconductor light emitting elements 1050 emitting light of different colors may be placed together into the fluid. For example, the semiconductor light emitting elements 1050 placed into the fluid may include at least two types of semiconductors among blue semiconductor light emitting elements that emit blue light, green semiconductor light emitting elements that emit green light, and red semiconductor light emitting elements that emit red light. In this case, the semiconductor light emitting elements 1050 that emit light of different colors may have different shapes, and preset positions of the assembly substrate 1000 on which the semiconductor light emitting elements 1050 that emit light of different colors are to be seated may also have different shapes. Accordingly, the semiconductor light emitting elements 1050 that emit a specific color may be seated at specific positions of the assembly substrate 1000.

That is, when self-assembly is carried out while the semiconductor light emitting elements 1050 that emit light of different colors are simultaneously placed into the chamber, the semiconductor light emitting elements 1050 may have different shapes according to their emitting colors, thereby allowing differentiation of assembly positions.

Next, applying a voltage to at least some of the assembly electrodes 1020 to allow the semiconductor light emitting elements 1050 to be seated at preset positions of the assembly substrate 1000 (S200) may be carried out.

A voltage may be applied to all the assembly electrodes 1020 disposed on the assembly substrate 1000 when assembling the semiconductor light emitting elements having a single color or assembling the semiconductor light emitting elements that emit light of different colors at the same time, a voltage may be applied to some of the assembled electrodes 1020 when sequentially assembling the semiconductor light emitting elements that emit light of different colors.

An electric field may be formed on one surface of the assembly substrate 1000 on which the assembly electrodes 1020 are disposed by a voltage applied to the assembly electrodes 1020, and the semiconductor light emitting elements 1050 may be guided to the assembly substrate 1000 by the electric field, and seated at preset positions. At this time, the semiconductor light emitting elements that emit light of different colors may be seated at preset positions of the assembly substrate 1000 having shapes corresponding thereto.

Meanwhile, although omitted in the description, forming a magnetic field to move the semiconductor light emitting elements 1050 may be carried out prior to applying a voltage to the assembly electrodes 1020 to form an electric field.

That is, according to the self-assembly method, the semiconductor light emitting elements 1050 may move along a magnetic field, and may be held on the assembly substrate 1000 by an electric field formed in the assembly substrate 1000.

On the other hand, even when self-assembly is completed, an electric field for holding the semiconductor light emitting elements 1050 may be continuously formed on the assembly substrate 1000 until the assembly substrate 1000 is separated from the fluid such that one side of the assembly substrate 1000 faces in a direction opposite to a bottom surface of the chamber.

According to an embodiment of the present disclosure, forming a covalent bond between the semiconductor light emitting elements 1050 and a surface of the assembly substrate 1000 such that the semiconductor light emitting elements 1050 are fixed to the assembly substrate 1000 (S300) may be performed. According to an embodiment of the present disclosure, the semiconductor light emitting elements 1050 may be fixed to the assembly substrate 1000 by an electric field and a covalent bond.

According to the related art, the semiconductor light emitting elements 1050 were held on the assembly substrate 1000 by an electric field. However, since the electric field alone is not sufficient to hold the semiconductor light emitting elements 1050, a phenomenon in which the semiconductor light emitting elements 1050 are released from one surface of the assembly substrate 1000 often occurs due to a minute impact applied to the assembly substrate 1000, a pressure applied to the assembly substrate 1000 or the like when separating the assembly substrate 1000 contained in the fluid from the fluid.

According to an embodiment of the present disclosure, since the semiconductor light emitting elements 1050 seated on the assembly substrate 1000 form a covalent bond with the assembly substrate 1000, surface energy acting between the surface of the assembly substrate 1000 and the semiconductor light emitting elements 1050 may be maximized, thereby having an effect capable of preventing the semiconductor light emitting elements 1050 from being released from the assembly substrate 1000 due to an impact or the like.

A covalent bond may be formed between surfaces of the semiconductor light emitting elements 1050 and the surface of the assembly substrate 1000, and for example, may be formed between a passivation layer 1057 surrounding a surface of the semiconductor light emitting element 1050 and the dielectric layer 1030 corresponding to a bottom surface of the cell of the assembly substrate 1000 on which the semiconductor light emitting element 1050 is mounted.

The forming a covalent bond between the semiconductor light emitting elements 1050 and the surface of the assembly substrate 1000 (S300) may be carried out at the same time as the seating the semiconductor light emitting elements 1050 at preset positions of the assembly substrate 1000 (S200), or after the seating the semiconductor light emitting elements 1050 (S200) is completed.

Preferably, the forming a covalent bond between the semiconductor light emitting elements 1050 and the surface of the assembly substrate 1000 may be carried out at the same time as the seating the semiconductor light emitting elements 1050 at preset positions of the assembly substrate 1000.

Next, separating the assembly substrate 1000 from the fluid (S400) may be performed. At this time, even when a pressure is applied to the surface of the assembly substrate 1000, the semiconductor light emitting elements 1050 may not be released from the assembly substrate 1000 since an electric field is continuously formed in the assembly substrate 1000, and a covalent bond is formed between the semiconductor light emitting elements 1050 and the surface of the assembly substrate 1000.

Next, cleaving the covalent bond formed between the semiconductor light emitting elements 1050 and the surface of the assembly substrate 1000 (S500) may be performed. In detail, the corresponding step may be performed after one side of the assembly substrate 1000 on which the semiconductor light emitting elements 1050 are seated is placed to face a direction opposite to a bottom surface of the chamber in a state of facing the bottom surface of the chamber.

Finally, transferring the semiconductor light emitting elements 1050 seated on the assembly substrate 1000 to the wiring substrate on which the wiring electrodes are disposed may be performed (S600). The semiconductor light emitting elements 1050 seated on the assembly substrate 1000 may be primarily transferred to a stamp made of a PDMS material, and then transferred to the wiring substrate. The wiring electrodes may be previously disposed on the wiring substrate, or a process of forming the wiring electrodes may be performed after the semiconductor light emitting elements 1050 are transferred.

According to an embodiment of the present disclosure, since the covalent bond formed between the semiconductor light emitting elements 1050 and the surface of the assembly substrate 1000 is cleaved prior to the transfer step, the semiconductor light emitting elements 1050 may be transferred with a high yield to a stamp having a high surface energy with respect to the semiconductor light emitting elements 1050 compared to the assembly substrate 1000.

Hereinafter, forming a covalent bond between the semiconductor light emitting elements 1050 and the surface of the assembly substrate 1000 (S300) and cleaving the covalent bond formed between the semiconductor light emitting elements 1050 and the surface of the assembly substrate 1000 (S500) will be described in detail.

First, the semiconductor light emitting elements 1050 and the assembly substrate 1000 may be surface-treated to form a state of enabling a covalent bond. The surface treatment of the semiconductor light emitting elements 1050 and the assembly substrate 1000 may be performed prior to self-assembly, and the semiconductor light emitting elements 1050 and the assembly substrate 1000 may be disposed in a chamber containing a fluid in a state of being surface-treated as will be described below.

The semiconductor light emitting elements 1050 and the surface of the assembly substrate 1000 may include at least one of a predetermined functional group and a predetermined compound formed through a surface treatment. A predetermined functional group and a predetermined compound may be capable of forming a covalent bond.

The surfaces of the semiconductor light emitting elements 1050 and the surface of the assembly substrate 1000 on which a predetermined functional group and/or a predetermined compound are formed may be the passivation layer 1057 and the dielectric layer 1030, respectively, and the passivation layer 1057 and the dielectric layer 1030 may be a layer formed of an inorganic material (e.g., $SiO_2$, $SiN_x$, etc.).

For example, in order to form a predetermined functional group on the semiconductor light emitting elements 1050 and the surface of the assembly substrate 1000, $O_2$ plasma treatment or SPM (piranha) cleaning may be carried out. Through this, the semiconductor light emitting elements 1050 and the surface of the assembly substrate 1000 may be activated to form a hydrophilic functional group. For example, the hydrophilic functional group may be a hydroxyl group.

Meanwhile, a predetermined compound forming a covalent bond with a functional group may be bonded to at least any one of the semiconductor light emitting elements 1050 and the surface of the assembly substrate 1000. In this case, the predetermined compound may be a silane coupling agent, and the silane coupling agent may include a reactor for forming a Si—O bond or a C—O bond with the semiconductor light emitting elements 1050 and the surface of the assembly substrate 1000.

Preferably, the silane coupling agent may be bonded only to the surface of the assembly substrate 1000 or to both the surfaces of the assembly substrate 1000 and the semiconductor light emitting elements 1050. The silane coupling angle can bonded only to the surface of the semiconductor light emitting element 1050, but in the present specification, an embodiment in which the silane coupling agent is bonded only to the surface of the assembly substrate 1000 or bonded to both the surfaces of the semiconductor light emitting element 1050 and the surface of the assembly substrate 1000 will be described.

Figure 15:
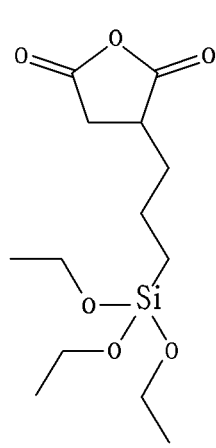
FIG. 15, including (a), (b), (c) and (d) (also collectively referred to below as FIG. 15), illustrates views showing various compounds for a surface treatment of an assembly substrate.
Figure 15:
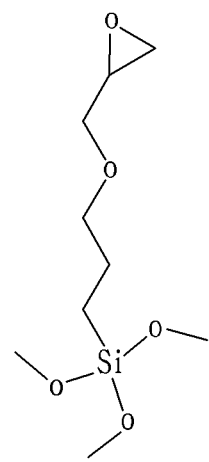
Figure 15:
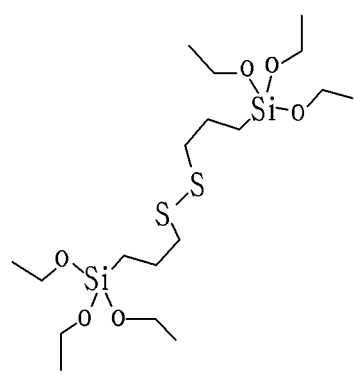
Figure 15:
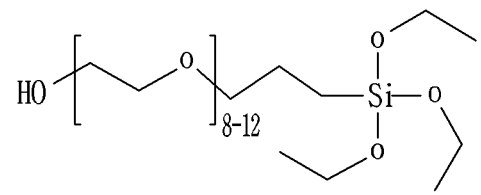

FIG. 15 includes views showing various compounds for a surface treatment of an assembly substrate.

For example, in order to bond the silane coupling agent to a surface of the assembly substrate 1000, the assembly substrate 1000 may be immersed in a 99.5% EtOH solution containing any one of tetrapropenyl succinic anhydride (TPSA), 3-glycidoxypropyl trimethoxysilane (GPTMS), bis[3-(triethoxysilyl)propyl]di-sulfide (BTD), and succinic anhydride triehoxysilane (SATES) at a predetermined concentration for a predetermined period of time. In addition, it may also be possible to form a multilayer structure by sequentially treating the assembly substrate 1000 and the like in solutions containing different compounds for a surface treatment.

In the above, the type of the compound for the surface treatment, the solution concentration, the surface treatment time period, and the like may be appropriately selected and implemented, and the type of the compound is not limited to those illustrated above.

Meanwhile, a covalent bond may be formed between the semiconductor light emitting element 1050 and the surface of the assembly substrate 1000 through heat-treating the assembly substrate 1000 subsequent to the surface treatment.

Specifically, a covalent bond may be formed between a functional group formed on surfaces of the semiconductor light emitting elements 1050 and a compound formed on the surface of the assembly substrate 1000, or between compounds formed on the semiconductor light emitting elements 1050 and the surface of the assembly substrate 1000 through a heat treatment.

In this case, a heat treatment temperature may vary depending on the type of a predetermined functional group or a predetermined compound formed on the semiconductor light emitting elements 1050 or the surface of the assembly substrate 1000, but it is preferable not to exceed 250° C. At a temperature exceeding 250° C., there is a risk in that the semiconductor light emitting elements 1050 may be damaged.

On the other hand, a heat treatment is only an embodiment for forming a covalent bond, and energy may of course be supplied in various ways to form a covalent bond between the assembly substrate 1000 and the semiconductor light emitting element 1050.

According to an embodiment of the present disclosure, a covalent bond formed between the semiconductor light emitting elements 1050 and the assembly substrate 1000 may be cleaved after the assembly substrate 1000 is separated from the fluid in order to transfer the semiconductor light emitting elements 1050 to the wiring substrate.

Figure 16:
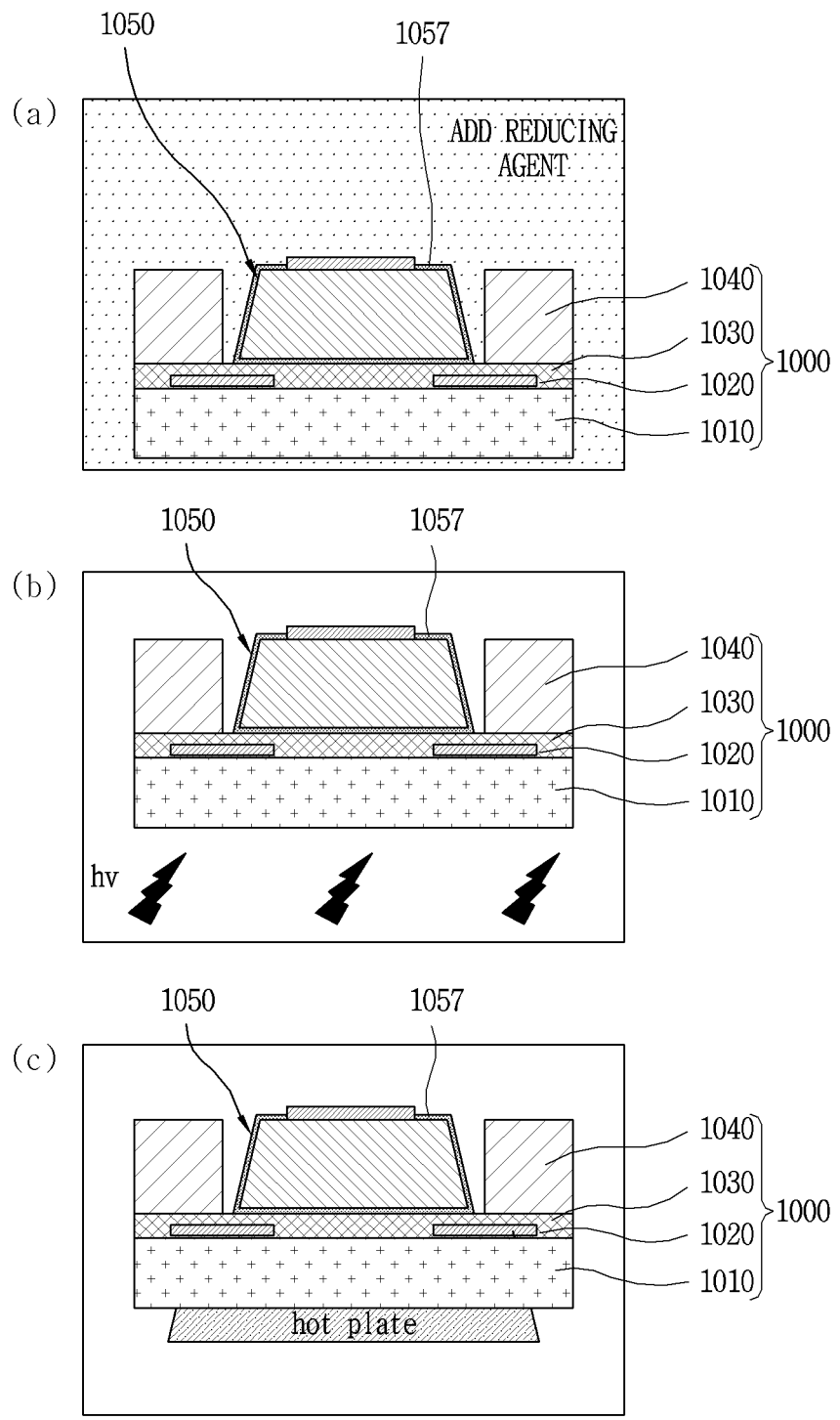
FIG. 16, including (a), (b) and (c) (also collectively referred to below as FIG. 16), illustrates views showing various embodiments of cleaving a covalent bond formed between a semiconductor light emitting element and an assembly substrate surface.

FIG. 16 includes views showing various embodiments of cleaving a covalent bond formed between a semiconductor light emitting element and an assembly substrate surface.

According to an embodiment of the present disclosure, a covalent bond formed between the semiconductor light emitting elements 1050 and the surface of the assembly substrate 1000 may be cleaved by any one of a reduction reaction, a light treatment, and a heat treatment, and the cleavage method may be determined according to the structure of a silane coupling agent that forms a covalent bond between the semiconductor light emitting element 1050 and the assembly substrate 1000.

Hereinafter, various embodiments for cleaving a covalent bond according to the structure of the silane coupling agent will be described.

Figure 17:
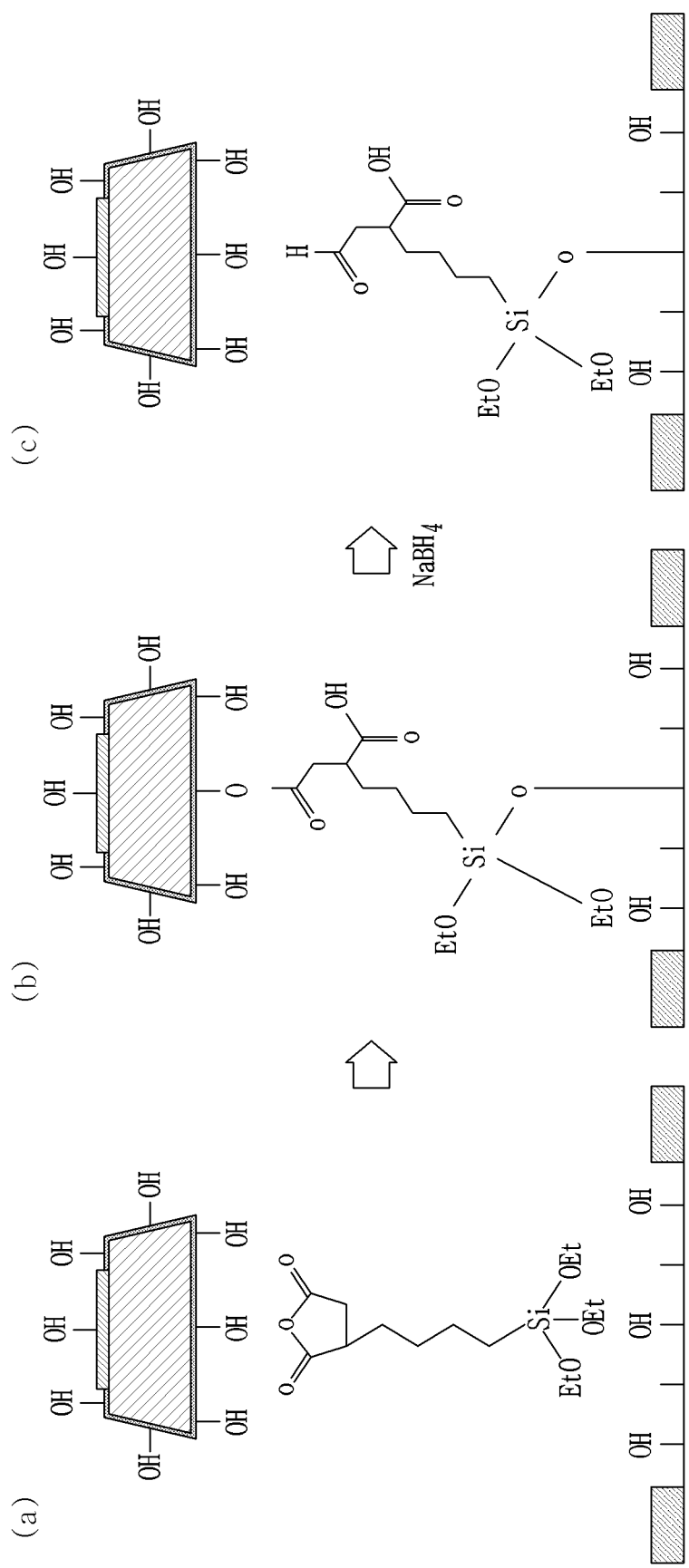
FIG. 17, including (a), (b) and (c) (also collectively referred to below as FIG. 17), illustrates views showing a first embodiment of a covalent bond formed between a semiconductor light emitting element and an assembly substrate surface, and a cleavage process thereof.

FIG. 17 is a view showing a first embodiment of a covalent bond formed between a semiconductor light emitting element and an assembly substrate surface, and a cleavage process thereof.

FIG. 17 is an embodiment in which TPSA is used as a silane coupling agent for forming a covalent bond between the semiconductor light emitting element 1050 and a surface of the assembly substrate 1000. A covalent bond may be formed between the surface of assembly substrate 1000 and the semiconductor light emitting element 1050 by forming a Si—O bond between the assembly substrate 1000 and the TPSA (reacting with a silane group of TPSA), and forming a C—O bond between the semiconductor light emitting element 1050 and the TPSA (reacting with a carbonyl group of the TPSA). At this time, surface treatment and heat treatment steps may be performed to form a covalent bond.

The covalent bond formed by TPSA may separate the semiconductor light emitting element 1050 from the assembly substrate 1000 by adding a reducing agent (e.g., $NaBH_4$) to break the C—O bond on a surface side of the semiconductor light emitting element 1050.

Figure 18:
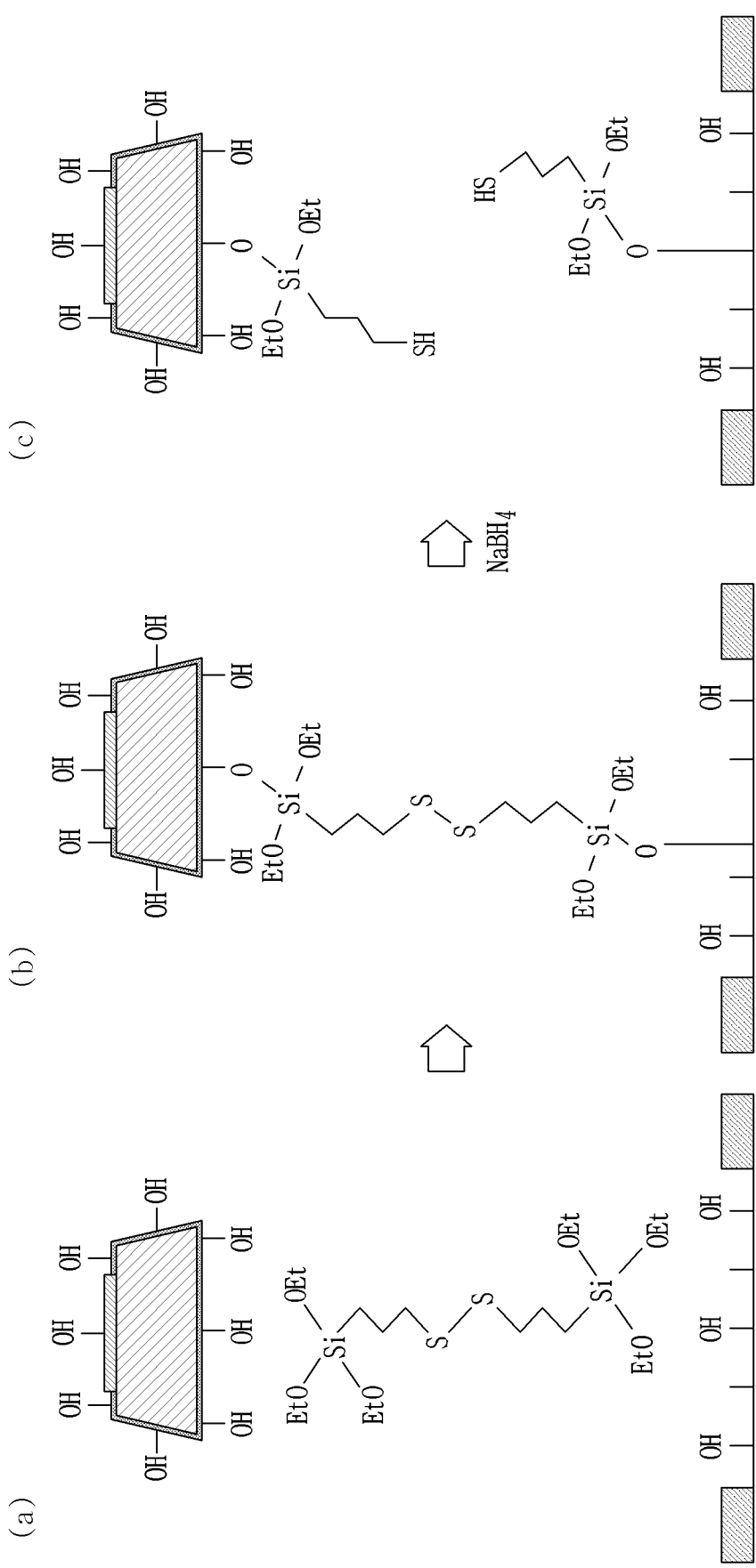
FIG. 18, including (a), (b) and (c) (also collectively referred to below as FIG. 18), illustrate views showing a second embodiment of a covalent bond formed between a semiconductor light emitting element and an assembly substrate surface, and a cleavage process thereof.

FIG. 18 is a view showing a second embodiment of a covalent bond formed between a semiconductor light emitting element and an assembly substrate surface, and a cleavage process thereof.

Referring to FIG. 18, a silane coupling agent according to an embodiment of the present disclosure may further include an intramolecular S—S bond. FIG. 18 is an embodiment in which BTD including an intramolecular S—S bond is used as a silane coupling agent for forming a covalent bond between the semiconductor light emitting element 1050 and a surface of the assembly substrate 1000. The assembly substrate 1000 and the semiconductor light emitting element 1050 react with silane groups on both sides of the BTD to form a Si—O bond, thereby forming a covalent bond between the surface of the assembly substrate 1000 and the semiconductor light emitting element 1050. At this time, surface treatment and heat treatment steps may be performed to form a covalent bond.

The covalent bond formed by BTD may separate the assembly substrate 1000 and the semiconductor light emitting element 1050 from each other by adding a reducing agent to break the intramolecular S—S bond. In the present embodiment, $NaBH_4$, dithiothreitol (DTT), mercapto ethanol, tris(2-carboxyethyl)phosphine (TCEP), or the like may be added as a reducing agent.

Figure 19:
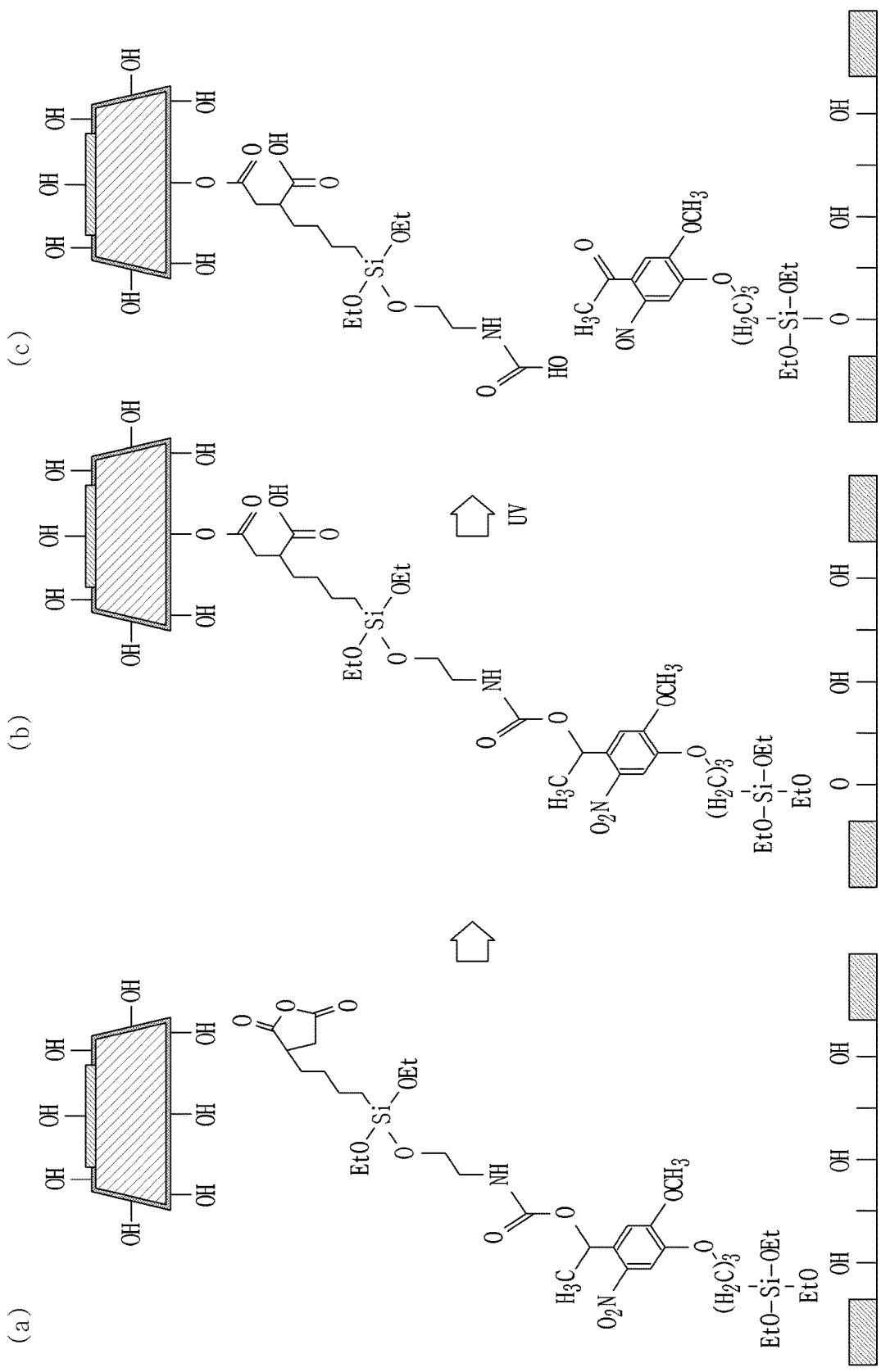
FIG. 19, including (a), (b) and (c) (also collectively referred to below as FIG. 19), illustrates views showing a third embodiment of a covalent bond formed between a semiconductor light emitting element and an assembly substrate surface, and a cleavage process thereof.

FIG. 19 is a view showing a third embodiment of a covalent bond formed between a semiconductor light emitting element and an assembly substrate surface, and a cleavage process thereof.

Referring to FIG. 19, a silane coupling agent according to an embodiment of the present disclosure may further include an intramolecular nitro benzyl group. In the silane coupling agent of FIG. 19, a C—O bond of the nitrobenzyl group included in the molecule may be broken by light treatment (photon absorption), thereby separating the semiconductor light emitting element 1050 and the assembly substrate 1000 from each other.

In addition, although not shown in the drawings, when a silane coupling agent is bonded to a surface of the semiconductor light emitting element 1050 and the surface of the assembly substrate 1000, respectively, a covalent bond may be formed between the semiconductor light emitting element 1050 and the assembly substrate 1000 by a Diels-Alder reaction, and the formed covalent bond may be cleaved by a reverse Diels-Alder reaction.

Specifically, either one of a silane coupling agent bonded to the surface of the semiconductor light emitting element 1050 and a silane coupling agent bonded to the surface of the assembly substrate 1000 may further include an intramolecular conjugate diene, and the other one an intramolecular multiple bond (hereinafter, referred to as a dienophile).

The conjugate diene and the dienophile form a cyclohexene derivative at a low temperature to form a covalent bond between the assembly substrate 1000 and the semiconductor light emitting element 1050, and the formed covalent bond may be re-cleaved into a conjugate diene and a dienophile again through high-temperature heat treatment, thereby separating the semiconductor light emitting element 1050 from the assembly substrate 1000.

As described above, a method of manufacturing a display device according to an embodiment of the present disclosure may include forming a covalent bond between the assembly substrate 1000 and the semiconductor light emitting element 1050, during or after self-assembly, thereby preparing for a phenomenon in which the semiconductor light emitting elements 1050 are separated from the assembly substrate 1000 due to an impact applied to the assembly substrate 1000 when the assembly substrate 1000 is separated from the fluid.

In addition, the method may include cleaving a covalent bond formed between the assembly substrate 1000 and the semiconductor light emitting element 1050 prior to transferring the assembled semiconductor light emitting elements 1050 to the wiring substrate so as to control surface energy acting between the assembly substrate 1000 and the semiconductor light emitting element 1050, thereby having an effect capable of transferring the semiconductor light emitting elements 1050 with a high yield.

The present disclosure described above will not be limited to configurations and methods according to the above-described embodiments, and all or part of each embodiment may be selectively combined and configured to make various modifications thereto.

The invention claimed is:

1. A method of manufacturing a display device by seating semiconductor light emitting elements placed into a chamber containing a fluid onto an assembly substrate at preset positions using electric and magnetic fields, the assembly substrate including assembly electrodes, the method comprising:
    placing the assembly substrate to be immersed in the fluid in the chamber while one surface of the assembly substrate including the assembly electrodes faces a bottom surface of the chamber;
    applying a voltage to at least some of the assembly electrodes to seat the semiconductor light emitting elements at the preset positions of the assembly substrate;
    forming a covalent bond between the semiconductor light emitting elements and a surface of the assembly substrate such that the semiconductor light emitting elements are fixed to the assembly substrate;
    separating the assembly substrate from the fluid;
    cleaving the covalent bond formed between the semiconductor light emitting elements and the surface of the assembly substrate; and
    transferring the semiconductor light emitting elements to a wiring substrate on which wiring electrodes are disposed,
    wherein the forming of the covalent bond between the semiconductor light emitting elements and the surface of the assembly substrate is carried out at the same time as the seating of the semiconductor light emitting elements at the preset positions of the assembly substrate, or after the seating of the semiconductor light emitting elements.

2. The method of claim 1, wherein the semiconductor light emitting elements and the surface of the assembly substrate comprise at least one of a predetermined functional group and a predetermined compound for forming the covalent bond between the semiconductor light emitting elements and the surface of the assembly substrate.

3. The method of claim 2, wherein the assembly substrate comprises:
    a base portion on which the assembly electrodes are disposed;
    a dielectric layer deposited on the base portion to cover the assembly electrodes; and
    a partition wall deposited on the dielectric layer while forming a cell in which one semiconductor light emitting element of the semiconductor light emitting elements is seated along an extension direction of the assembly electrode to overlap with a part of the assembly electrode, wherein the dielectric layer comprises at least one of the predetermined functional group and the predetermined compound.

4. The method of claim 2, wherein the predetermined functional group formed on the semiconductor light emitting elements and the surface of the assembly substrate is a hydroxyl group.

5. The method of claim 2, wherein the predetermined compound bonded to the semiconductor light emitting elements and the surface of the assembly substrate is a silane coupling agent, and the silane coupling agent is bonded to at least one of the semiconductor light emitting elements and the surface of the assembly substrate.

6. The method of claim 5, wherein the silane coupling agent comprises a reactor for forming either one of a Si—O bond and a C—O bond with the semiconductor light emitting elements and the surface of the assembly substrate.

7. The method of claim 6, wherein the silane coupling agent further comprises an intramolecular S—S bond.

8. The method of claim 6, wherein the silane coupling agent further comprises an intramolecular nitro benzyl group.

9. The method of claim 6, wherein when the silane coupling agent is coupled to a surface of the semiconductor light emitting elements and a surface of the assembly substrate, either one of the silane coupling agent coupled to the surface of the semiconductor light emitting elements and the silane coupling agent coupled to the surface of the assembly substrate further comprises an intramolecular conjugate diene, and the other one further comprises an intramolecular multiple bond.

10. The method of claim 7, wherein the intramolecular S—S bond is broken by a reduction reaction.

11. The method of claim 8, wherein a C—O bond of the intramolecular nitro benzyl group is broken by a UV light treatment.

12. The method of claim 5, wherein, the cleaving of the covalent bond breaks a C—O bond or an intramolecular S—S bond of the silane coupling agent to cleave the silane coupling agent into at least two parts, and wherein, after the cleaving of the covalent bonds, a first part of the at least two parts are connected to at least one of the semiconductor light emitting elements and a second part of the at least two parts are connected to the surface of the assembly substrate.

13. The method of claim 12, wherein a silicon atom of the silane coupling agent is connected to the assembly substrate after the cleaving of the covalent bonds.

14. The method of claim 12, wherein, after the cleaving of the covalent bonds, one silicon atom of the silane coupling agent is connected to the at least one of the semiconductor light emitting elements and another silicon atom of the silane coupling agent is connected to the assembly substrate.

15. The method of claim 2, wherein the covalent bond is formed between the semiconductor light emitting elements and the predetermined compound bonded to the surface of the assembly substrate, or the covalent bond is formed between the predetermined compound bonded to the surface of the assembly substrate and the predetermined functional group formed on surfaces of the semiconductor light emitting elements.

16. The method of claim 1, wherein the covalent bond formed between the semiconductor light emitting elements and the surface of the assembly substrate is cleaved by any one of a reduction reaction, a light treatment and a heat treatment.

17. A display device comprising:
a panel to display an image;
semiconductor light emitting elements disposed on the panel; and
a wiring substrate included in the panel, and configured to accommodate the semiconductor light emitting elements,
wherein the semiconductor light emitting elements include a coating of at least one of a predetermined functional group and a predetermined compound, the predetermined compound including a silane coupling agent having a broken covalent bond,
wherein the broken covalent bond includes a C—O bond or an intramolecular S—S bond of the silane coupling agent that is broken to cleave the silane coupling agent into at least two parts including a first part and a second part, and
wherein the first part or the second part is connected to the semiconductor light emitting elements.

18. The display device of claim 17, wherein a silicon atom of the silane coupling agent is included in the first part or the second part that is connected to the semiconductor light emitting elements.

* * * * *